United States Patent
Yeo et al.

(10) Patent No.: US 10,263,091 B2
(45) Date of Patent: Apr. 16, 2019

(54) MULTIPLE GATE FIELD EFFECT TRANSISTORS HAVING OXYGEN-SCAVENGED GATE STACK

(71) Applicant: Taiwan Semiconductor Manufacturing Company, Ltd., Hsin-Chu (TW)

(72) Inventors: Yee-Chia Yeo, Hsin-Chu (TW); Chih Chieh Yeh, Taipei (TW); Chih-Hsin Ko, Fongshan (TW); Cheng-Hsien Wu, Hsin-Chu (TW); Liang-Yin Chen, Hsin-Chu (TW); Xiong-Fei Yu, Hsin-Chu (TW); Yen-Ming Chen, Chu-Pei (TW); Chan-Lon Yang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 163 days.

(21) Appl. No.: 15/379,067

(22) Filed: Dec. 14, 2016

(65) Prior Publication Data
US 2017/0092732 A1 Mar. 30, 2017

Related U.S. Application Data

(63) Continuation of application No. 14/753,916, filed on Jun. 29, 2015, now Pat. No. 9,564,489.

(51) Int. Cl.
*H01L 29/76* (2006.01)
*H01L 29/49* (2006.01)
(Continued)

(52) U.S. Cl.
CPC .... *H01L 29/4966* (2013.01); *H01L 21/26513* (2013.01); *H01L 21/28088* (2013.01);
(Continued)

(58) Field of Classification Search
CPC ............ H01L 29/66795–29/66818; H01L 2029/7858; H01L 29/7855–29/7856;
(Continued)

(56) References Cited

U.S. PATENT DOCUMENTS 7,517,764 B2   4/2009  Booth, Jr. et al.
7,855,411 B2   12/2010 Hsu et al.
(Continued)

FOREIGN PATENT DOCUMENTS

KR   101452122 B1   10/2014
TW   200807717 A    2/2008
(Continued)

OTHER PUBLICATIONS

Ando, "Ultimate Scaling of High-k Gate Dielectrics: Higher-K or Interfacial Layer Scavenging?," Materials, vol. 5, Jan. 29, 2012, pp. 478-500.
(Continued)

*Primary Examiner* — Kevin M Picardat
(74) *Attorney, Agent, or Firm* — Slater Matsil, LLP

(57) ABSTRACT

A method includes forming a silicon cap layer on a semiconductor fin, forming an interfacial layer over the silicon cap layer, forming a high-k gate dielectric over the interfacial layer, and forming a scavenging metal layer over the high-k gate dielectric. An anneal is then performed on the silicon cap layer, the interfacial layer, the high-k gate dielectric, and the scavenging metal layer. A filling metal is deposited over the high-k gate dielectric.

20 Claims, 30 Drawing Sheets

(51) Int. Cl.

| | | |
|---|---|---|
| *H01L 29/10* | (2006.01) | |
| *H01L 29/66* | (2006.01) | |
| *H01L 29/165* | (2006.01) | |
| *H01L 21/28* | (2006.01) | |
| *H01L 29/51* | (2006.01) | |
| *H01L 29/78* | (2006.01) | |
| *H01L 21/265* | (2006.01) | |
| *H01L 21/324* | (2006.01) | |
| *H01L 29/06* | (2006.01) | |
| *H01L 29/08* | (2006.01) | |
| *H01L 29/161* | (2006.01) | |
| *H01L 29/423* | (2006.01) | |
| *H01L 29/786* | (2006.01) | |

(52) U.S. Cl.
CPC .. *H01L 21/28185* (2013.01); *H01L 21/28238* (2013.01); *H01L 21/324* (2013.01); *H01L 29/0653* (2013.01); *H01L 29/0673* (2013.01); *H01L 29/0847* (2013.01); *H01L 29/1054* (2013.01); *H01L 29/161* (2013.01); *H01L 29/165* (2013.01); *H01L 29/42392* (2013.01); *H01L 29/517* (2013.01); *H01L 29/66545* (2013.01); *H01L 29/66636* (2013.01); *H01L 29/66795* (2013.01); *H01L 29/7851* (2013.01); *H01L 29/78651* (2013.01); *H01L 29/78684* (2013.01); *H01L 29/78696* (2013.01); *H01L 29/7843* (2013.01)

(58) Field of Classification Search
CPC ........... H01L 29/41791; H01L 29/7851; H01L 21/823431; H01L 21/823821; H01L 27/0886; H01L 27/0924; H01L 27/1211; H01L 21/845

See application file for complete search history.

(56) References Cited

U.S. PATENT DOCUMENTS

| | | | |
|---|---|---|---|
| 8,445,340 B2 | 5/2013 | Lee et al. | |
| 8,487,378 B2 | 7/2013 | Goto et al. | |
| 8,597,995 B2* | 12/2013 | Xu | H01L 21/28088 |
| | | | 257/E21.639 |
| 8,729,634 B2 | 5/2014 | Shen et al. | |
| 8,772,116 B2 | 7/2014 | Callegari et al. | |
| 8,790,988 B2* | 7/2014 | Choi | H01L 27/0629 |
| | | | 438/382 |
| 8,826,213 B1 | 9/2014 | Ho et al. | |
| 8,887,106 B2 | 11/2014 | Ho et al. | |
| 8,912,067 B2 | 12/2014 | Huguenin et al. | |
| 9,087,902 B2 | 7/2015 | Lee et al. | |
| 9,142,547 B2* | 9/2015 | Stahrenberg | H01L 27/0629 |
| 9,343,357 B2 | 5/2016 | Ku et al. | |
| 2011/0012205 A1* | 1/2011 | Lin | H01L 21/28123 |
| | | | 257/368 |
| 2011/0079829 A1 | 4/2011 | Lai et al. | |
| 2012/0083110 A1 | 4/2012 | Huguenin et al. | |
| 2012/0280288 A1 | 11/2012 | Ando et al. | |
| 2013/0256802 A1 | 10/2013 | Jagannathan et al. | |
| 2013/0277766 A1* | 10/2013 | Kelwing | H01L 21/28185 |
| | | | 257/411 |
| 2013/0292777 A1* | 11/2013 | Liaw | G11C 11/412 |
| | | | 257/369 |
| 2013/0295759 A1 | 11/2013 | Lu et al. | |
| 2014/0282326 A1 | 9/2014 | Chen et al. | |
| 2015/0035073 A1 | 2/2015 | Ando et al. | |
| 2015/0206875 A1 | 7/2015 | Lee et al. | |
| 2016/0013316 A1 | 1/2016 | Kuang et al. | |
| 2016/0020210 A1* | 1/2016 | Liaw | H01L 29/66545 |
| | | | 257/369 |

FOREIGN PATENT DOCUMENTS

| | | |
|---|---|---|
| TW | 200905887 A | 2/2009 |
| TW | 201118952 A | 6/2011 |

OTHER PUBLICATIONS

Ando et al., "Understanding Mobility Mechanisms in Extremely Scaled HfO2 (EOT 0.42 nm) Using Remote Interfacial Layer Scavenging Technique and V-tuning Dipoles with Gate-First Process," IEEE International Electron Devices Meeting, Dec. 7-9, 2009, 4 pages.

Chau et al., "High-k/Metal-Gate Stack and Its MOSFET Characteristics," IEEE Electron Device Letters, vol. 25, No. 6, Jun. 2004, 3 pages.

Wilk et al., "High-K gate dielectrics: Current status and materials properties considerations," Journal of Applied Physics, vol. 89, No. 10, May 15, 2001, 33 pages.

Yeo et al., "MOSFET Gate Leakage Modeling and Selection Guide for Alternative Gate Dielectrics Based on Leakage Considerations," IEEE Transactions on Electron Devices, vol. 50, No. 4, Apr. 2003, pp. 1027-1035.

* cited by examiner

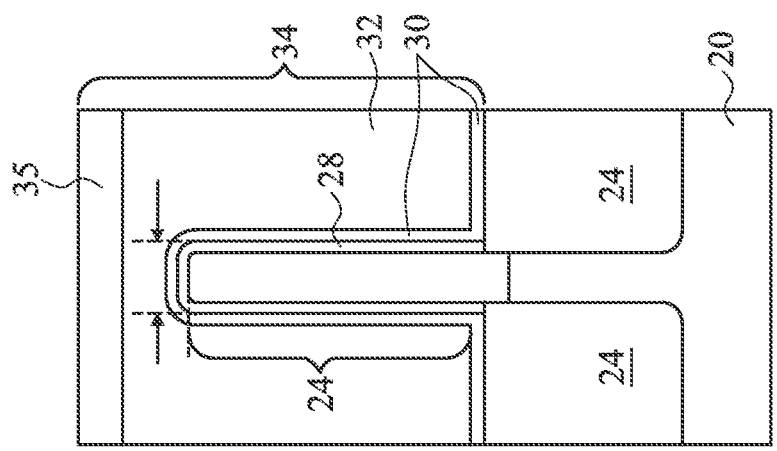

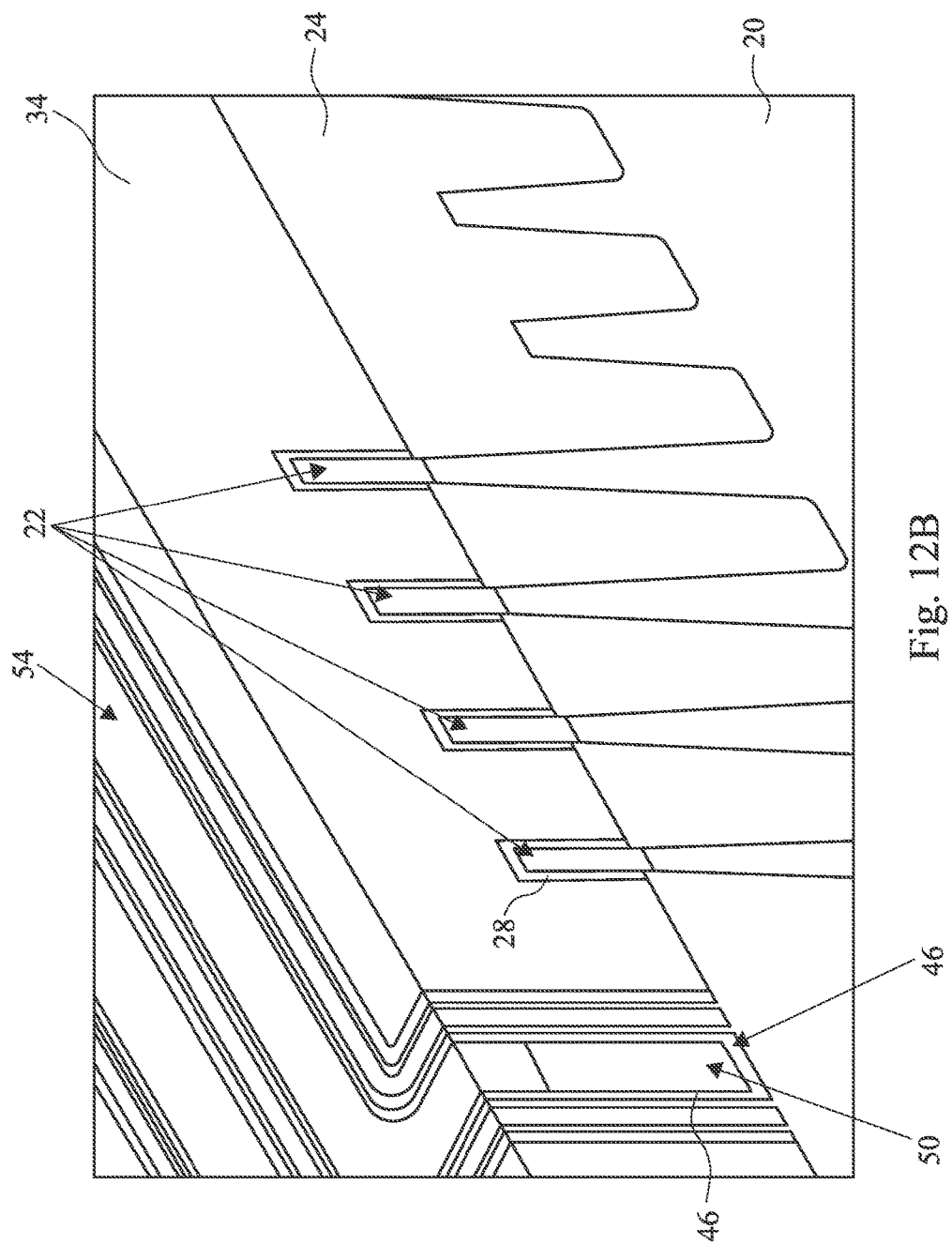

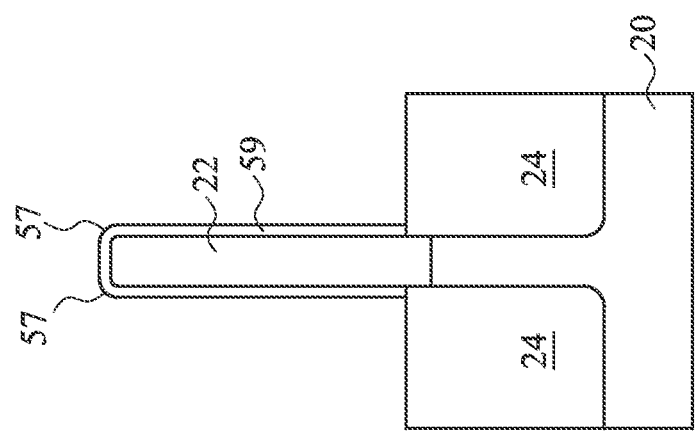

US 10,263,091 B2

MULTIPLE GATE FIELD EFFECT TRANSISTORS HAVING OXYGEN-SCAVENGED GATE STACK

PRIORITY CLAIM AND CROSS-REFERENCE

This application is a continuation of U.S. patent application Ser. No. 14/753,916, entitled "Multiple Gate Field Effect Transistors Having Oxygen-Scavenged Gate Stack," filed on Jun. 29, 2015, which application is incorporated herein by reference.

This application relates to U.S. patent application Ser. No. 15/220,909, entitled "Multiple Gate Field Effect Transistors Having Oxygen-Scavenged Gate Stack," filed on Jul. 27, 2016, which application is hereby incorporated herein by reference.

BACKGROUND

As the gate length of the field-effect transistor is reduced, short-channel effects such as drain-induced barrier lowering are worsened and off-state leakage current is increased. To suppress short-channel effects and to reduce off-state leakage current, the equivalent silicon oxide thickness (EOT) needs to be scaled down. For the field-effect transistors with gate lengths well below 20 nm, the EOT needs to be reduced below 1 nm.

Reducing the EOT by reducing the physical thickness of a given dielectric material increases the gate leakage current density, which is undesirable, as the gate leakage current density needs to be kept in check within certain limits. By adopting a gate dielectric with a higher dielectric permittivity or k value, the physical thickness of the gate dielectric material can be increased for a given gate capacitance density, and the gate leakage current density can be effectively suppressed.

High-k value gate dielectric is used with metal gate electrodes in advanced Complementary Metal-Oxide-Semiconductor (CMOS) technology generations to enable the further scaling of the transistor gate length while controlling short-channel effect. A common high-k value gate dielectric used in the industry is hafnium oxide ($HfO_2$) with a k value of about 20 or higher. $HfO_2$ is commonly formed on an interfacial layer comprising $SiO_2$, which is formed using atomic layer deposition. Hafnium silicate ($HfSi_xO_y$) with a medium k value of about 10 may also be used.

The total EOT of a gate dielectric stack including a high-k value gate dielectric on an interfacial layer is equal to the sum of the EOT of the high-k gate dielectric and the EOT of the interfacial layer. To reduce the EOT of the gate dielectric stack, a gate dielectric material with a k value higher than that of $HfO_2$, such as lanthanum oxide or other dielectric materials with k value larger than 25, may be used in the gate stack. Alternatively, the thickness of the interfacial layer may be reduced or eliminated by scavenging oxygen from it. In other approaches for reducing the EOT, the permittivity of the interfacial layer may be increased.

In above-mentioned approaches, the interface state density should be kept low (preferably close to or below $10^{11}/cm^2eV$) to prevent the degradation of the carrier mobility in the channel, and the gate stack reliability should not be worsened.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A through 17C illustrate the cross-sectional views in the formation of a Fin Field-Effect Transistor (FinFET) in accordance with some embodiments.

DETAILED DESCRIPTION

Figure 1A:
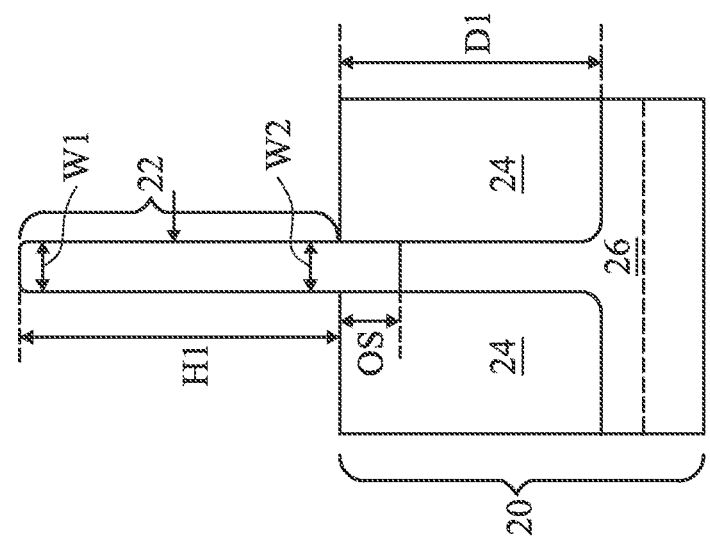

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method of forming a Fin Field-Effect Transistor (FinFET) through oxygen scavenging is provided in accordance with various exemplary embodiments. The intermediate stages of forming the FinFET are illustrated. Some variations of the embodiments are discussed. Throughout the various views and illustrative embodiments, like reference numbers are used to designate like elements.

Figure 20:
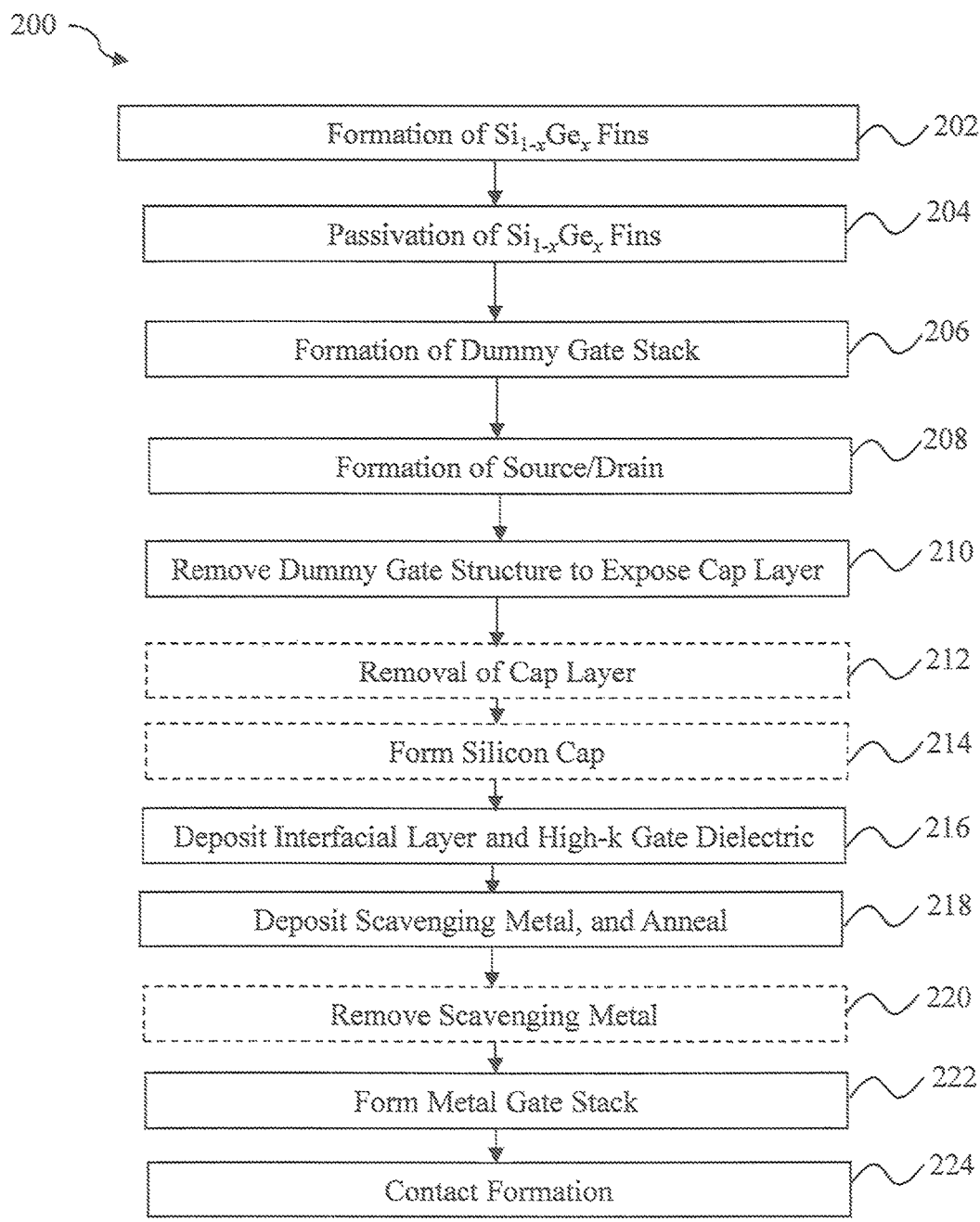
FIG. 20 illustrates a process flow for forming a FinFET in accordance with some embodiments.

FIGS. 1A through 17C illustrate the cross-sectional views and the perspective views of intermediate stages in the formation of a FinFET in accordance with some embodiments. The steps shown in FIGS. 1A through 17C are also illustrated schematically in the process flow 200 shown in FIG. 20. In the subsequent discussion, the process steps shown in FIGS. 1A through 17C are discussed referring to the process steps in FIG. 20.

Figure 1B:
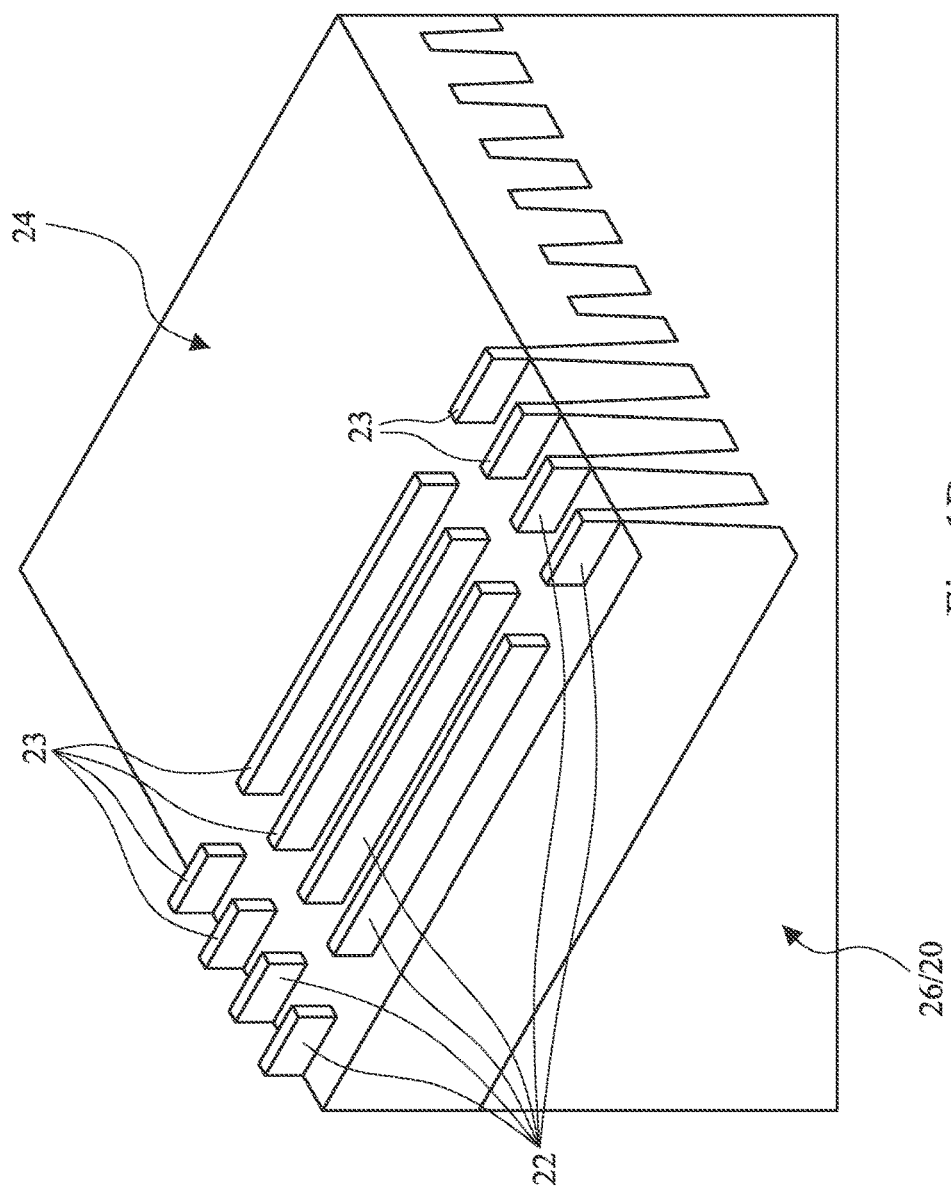

FIGS. 1A and 1B illustrate a cross-sectional view and a perspective view, respectively, of an integrated circuit structure. FIG. 1A illustrates the cross-sectional view of a single semiconductor fin 22 (among a plurality of fins 22 as shown in FIG. 1B). Semiconductor fin 22 is formed over semiconductor substrate 20, which may be a part of a wafer. In accordance with some embodiments of the present disclosure, substrate 20 is a semiconductor substrate, which may further be a silicon substrate, a relaxed silicon carbon substrate, a relaxed silicon germanium substrate, a silicon-on-insulator substrate or a substrate formed of other semiconductor materials. Substrate 20 may be lightly doped with a p-type or an n-type impurity.

Semiconductor fin 22 protrudes over the top surfaces of nearby isolation regions 24, which may be Shallow Trench Isolation (STI) regions. In accordance with some embodiments, semiconductor fin 22 is a silicon germanium fin, wherein the silicon germanium is expressed as $Si_{1-x}Ge_x$, with value x being the mole fraction (or atomic percentage) of germanium. The germanium percentage x may be higher than about 0.2, higher than 0.4, higher than 0.6, or as high as 1. When germanium percentage x is 1, semiconductor fin 22 is a germanium fin free from silicon. The pitch of semiconductor fins 22 (FIG. 1B) may be smaller than 30 nm, smaller than 24 nm, or even smaller than 15 nm. The top fin width W1 may be smaller than 10 nm, smaller than about 8 nm, or even smaller than about 6 nm. Fin height H1 may be greater than about 30 nm, or greater than about 60 nm. Fin height H1 is the vertical displacement between the top surface of fin 22 and the top surfaces of isolation regions 24. Bottom fin width W2 may be equal to or slightly greater than top fin width W1. The sidewalls of semiconductor fin 22 are substantially straight and substantially vertical.

Isolation regions 24 are formed adjacent to semiconductor fin 22. In accordance with some embodiments of the present disclosure, isolation regions 24 are formed of silicon oxide, and may be deposited using Chemical Vapor Deposition (CVD). The interface between the silicon germanium that forms semiconductor fin 22 and the underlying substrate 20 may be offset from the surface of the isolation region. The offset OS may be in the range from between about −10 nm (when the interface is higher than the top surfaces of isolation regions 24) to about 10 nm (when the interface is lower than the top surfaces of isolation regions 24), as an example.

In accordance with some embodiments of the present disclosure, a relaxed or partially relaxed silicon germanium layer 26 is formed as a top portion of substrate 20. For example, FIG. 1A schematically illustrates $Si_{1-y}Ge_y$ layer 26. The germanium percentage y is lower than germanium percentage x of fin $Si_{1-x}Ge_x$ 22. By selecting x to be larger than y, the natural lattice constant of the $Si_{1-x}Ge_x$ fin 22, which forms the channel of the resulting FinFET, is larger than the natural lattice constant of $Si_{1-y}Ge_y$ layer 26. Accordingly, the channel ($Si_{1-x}Ge_x$) of the resulting FinFET will be under compressive stress or strain.

$Si_{1-x}Ge_x$ fins 22 may be formed together with silicon fins. FIG. 1B illustrates a plurality of $Si_{1-x}Ge_x$ fins 22 adjacent to a plurality of silicon fins 23 (free from germanium) formed on a relaxed or partially relaxed silicon germanium ($Si_{1-y}Ge_y$) layer 26. SiGe fins 22 and silicon fins 23 may, or may not, have the same physical dimensions such as fin widths W1 and W2 and/or fin height H1 (FIG. 1A). In accordance with some embodiments of the present disclosure, $Si_{1-x}Ge_x$ fins 22 are used to form p-channel FinFETs, while silicon fins 23 are used to form n-channel FinFETs. Since silicon fins 23 are formed on the fully or partially relaxed $Si_{1-y}Ge_y$ layer 26, silicon fins 23 are under tensile stress (strain) in the channel-length direction. The presence of tensile strain in the channel-length direction increases the electron mobility in silicon, and improves the drive currents and the speed of the n-channel FinFETs.

Figure 21A:
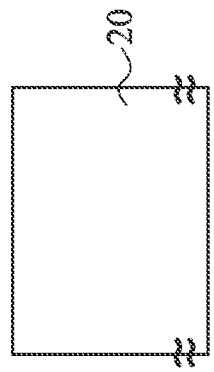
FIGS. 21A through 21F illustrate the cross-sectional views in the formation of semiconductor fins in accordance with some embodiments.
Figure 21B:
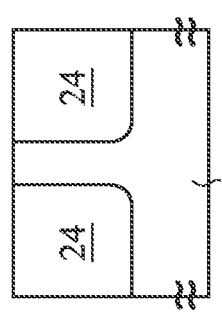
Figure 21C:
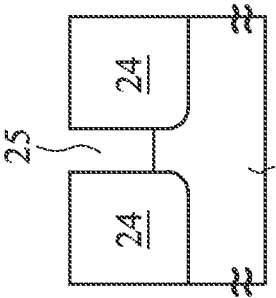
Figure 21D:
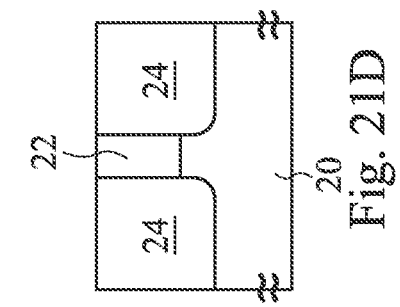
Figure 21E:
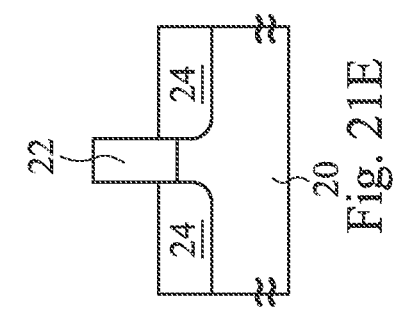
Figure 21F:
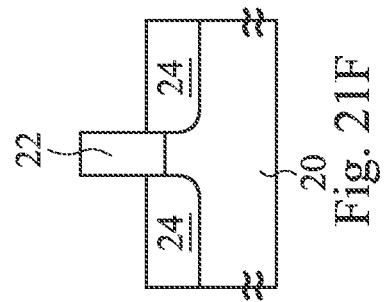

An exemplary process for forming $Si_{1-x}Ge_x$ fins 22 is briefly described as follows. The respective step is illustrated as step 202 in the process flow shown in FIG. 20. The corresponding steps in accordance with some embodiments are schematically illustrated in FIGS. 21A through 21F. First, as shown in FIG. 21A, semiconductor substrate 20 is provided. Semiconductor substrate 20 may be a silicon substrate, a relaxed SiGe substrate (or a relaxed SiGe layer on a silicon substrate), or formed of other materials, as aforementioned. STI regions 24 are formed extending into semiconductor substrate 20, as shown in FIG. 21B. Adjacent STI regions 24 sandwich narrow a strip of substrate 20 in between. The substrate strip may be recessed by etching, as shown in FIG. 21C, resulting in recess 25. The bottoms of recess 25 may be higher than the bottom surfaces of STI regions 24. Next, as shown in FIG. 21D, semiconductor region 22 is selectively grown in recess 25 (FIG. 21C) through epitaxy. Semiconductor region 22 may be formed silicon when substrate 20 is a SiGe substrate (or contains a relaxed SiGe layer), or may be a $Si_{1-x}Ge_x$ region when substrate 20 is a silicon substrate. STI regions 24 are then recessed to form semiconductor fins. For example, FIG. 21E illustrates SiGe fin 22 on substrate 20 formed of silicon, and FIG. 21F illustrates silicon fin 23 on substrate 20 comprising SiGe.

Figure 22A:
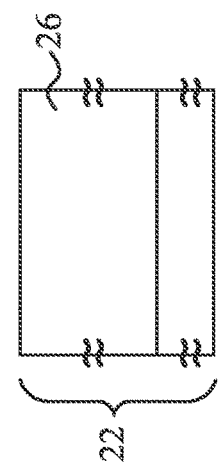
FIGS. 22A through 22G illustrate the cross-sectional views in the formation of semiconductor fins in accordance with some embodiments.
Figure 22B:
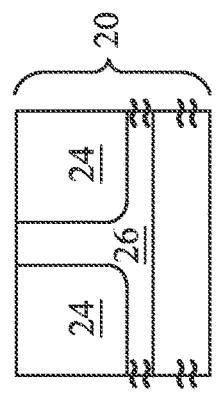
Figure 22C:
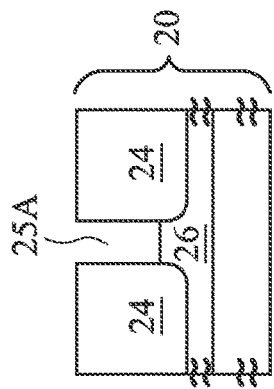
Figure 22D:
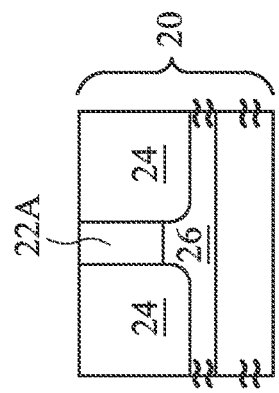
Figure 22E:
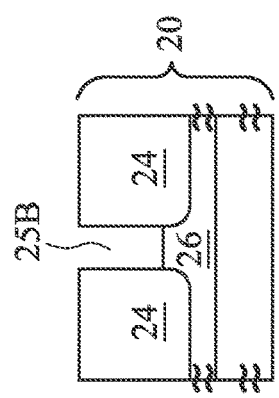
Figure 22F:
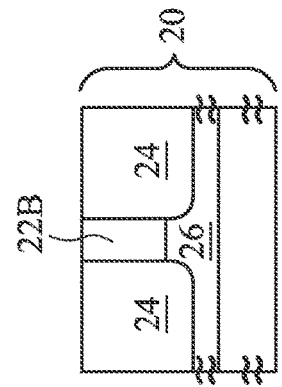
Figure 22G:
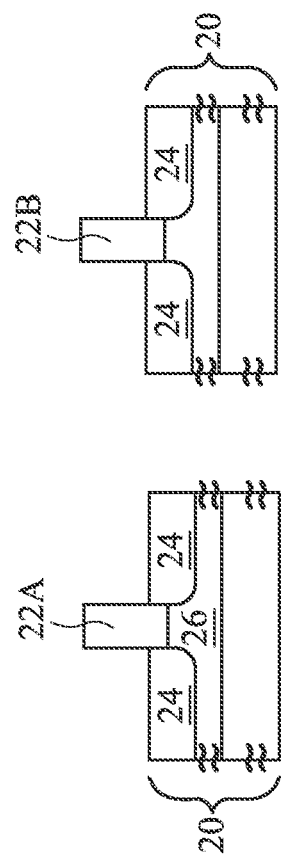

FIGS. 22A through 22G illustrate the formation of semiconductor fins 22A and 22B in accordance with some embodiments. Referring to FIG. 22A, substrate 20 is provided. Substrate 20 may be a bulk silicon substrate, or may include a relaxed $Si_{1-y}Ge_y$ layer 26. FIG. 22B illustrates the formation of STI regions 24 in substrate 20 or relaxed SiGe layer 26. Next, as shown in FIG. 22C, recess 25A is formed by recessing a portion of substrate 20 or SiGe layer 26. Referring to FIG. 22D, $Si_{1-x}Ge_x$ region 22 (denoted as 22A) is formed in recess 25A (FIG. 22C) through epitaxy, wherein germanium atomic percentage x is greater than germanium atomic percentage y. Furthermore, at the time recess 25A is formed, recess 25B may be simultaneously formed, as shown in FIG. 22E. Referring to FIG. 22F, $Si_{1-z}Ge_z$ region 22 (denoted as 22B) is formed in recess 25B through epitaxy, wherein value germanium atomic percentage z is smaller than germanium atomic percentage y. In a subsequent step, STI regions 24 (as shown in FIGS. 22D and 22F) are recessed, resulting in the structure shown in FIG. 22G, in which fins 22 (including 22A and 22B) are formed on the same substrate 20.

The structure formed in the steps shown in FIGS. 21A through 21F and FIGS. 22A through 22G are also shown in FIGS. 1A and 1B. The resulting STI regions may have depth D1 (FIG. 1A) in the range between about 200 nm, and about 1,000 nm.

Figure 2:
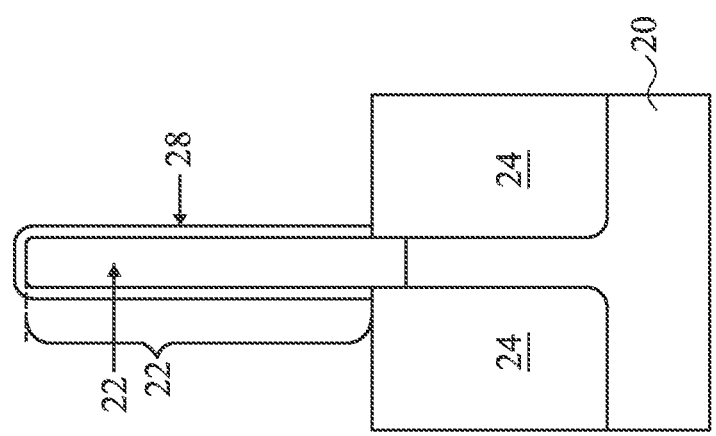

FIG. 2 illustrates the passivation of SiGe fin 22. The respective step is illustrated as step 204 in the process flow shown in FIG. 20. In accordance with some embodiments of the present disclosure, the passivation includes depositing cap layer 28 over fin 22. Cap layer 28 extends on, and contacts, the top surface and sidewalls of SiGe fin 22. Cap layer 28 protects SiGe fin 22 from the damage in subsequent processing. Cap layer 28 may be formed on both SiGe fins 22 and silicon fins 23 (FIG. 1B), or on SiGe fins 22 but not on silicon fins 23.

In accordance with some embodiments of the present disclosure, cap layer 28 is made of crystalline silicon, and can be formed over the SiGe fins 22 through low-temperature epitaxy using silane ($SiH_4$), disilane ($Si_2H_6$), trisilane ($Si_3H_8$), or other silicon-containing precursors such as high-order silanes. The silicon-containing precursors may also contain chlorine, e.g. $SiH_2Cl_2$. The epitaxy growth temperature may be an elevated temperature higher than room temperature (about 21° C.). For example, the temperature may be about 500° C. or lower, 425° C. or lower, and even 375° C. or lower. A low growth temperature minimizes the likelihood of germanium segregation during the epitaxy, wherein the segregation of germanium leads to the undesirable formation of a germanium cap. Cap layer 28 may have a thickness smaller than about 1.5 nm.

In accordance with some embodiments of the present disclosure, cap layer 28 is an amorphous silicon layer deposited by CVD. The deposition may be performed at about 400° C. or below. In accordance with yet alternative embodiments, cap layer 28 is a dielectric layer formed of silicon oxide ($SiO_2$) or other dielectrics. The formation methods may include Atomic Layer Deposition (ALD). Cap layer 28 may also comprise a III-V compound semiconductor layer such as Indium Aluminum Phosphide (InAlP) or Indium Gallium Phosphide (InGaP). It is appreciated that cap layer 28 may also comprise multiple layers or combinations of the materials in above-mentioned embodiments. For example, cap layer 28 may comprise amorphous silicon on crystalline silicon, $SiO_2$ on crystalline silicon, or $SiO_2$ on amorphous silicon on crystalline silicon.

Figure 3B:
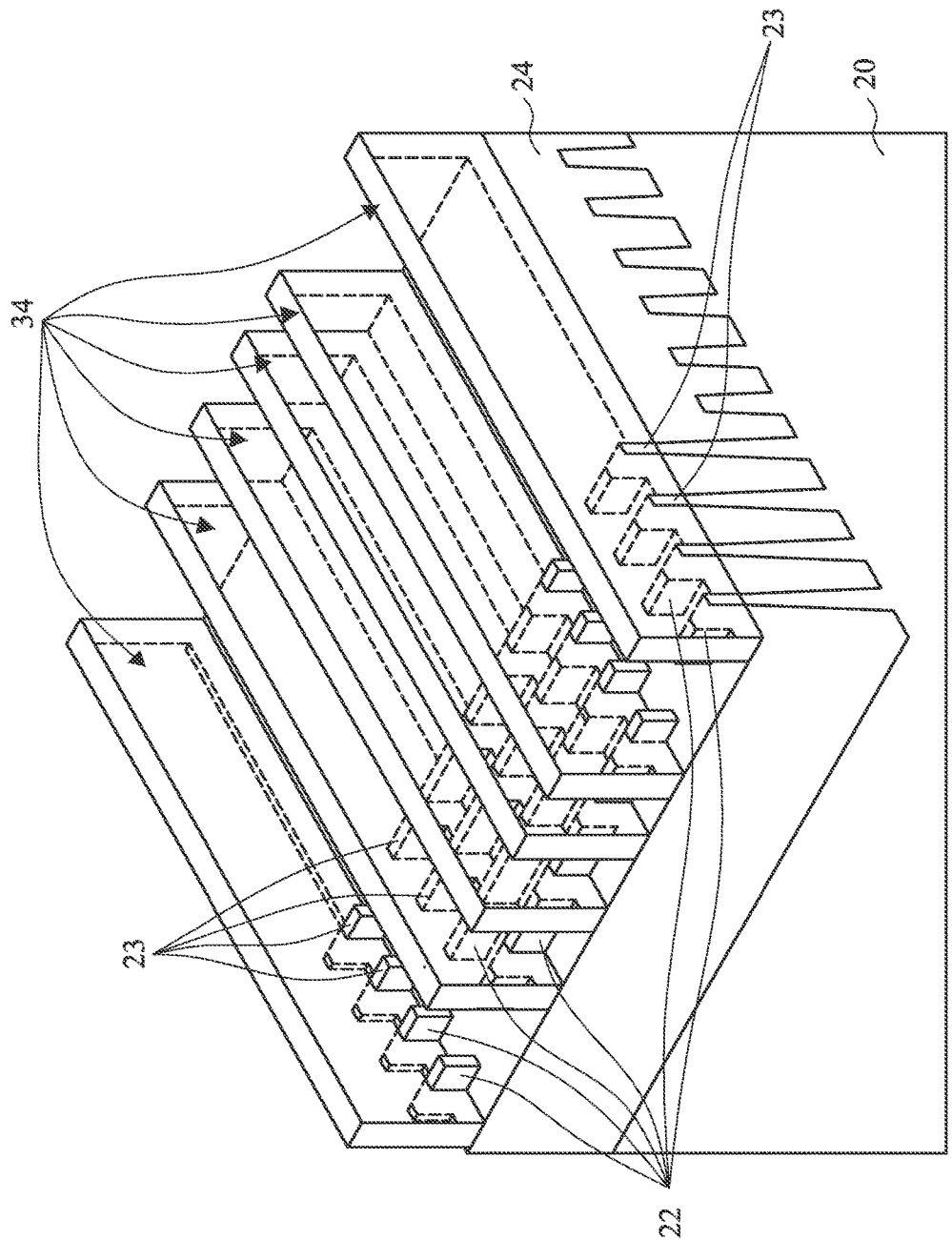

FIGS. 3A and 3B illustrate a cross-sectional view and a perspective view, respectively, in the formation of dummy gates 34. The respective step is illustrated as step 206 in the process flow shown in FIG. 20. In accordance with some embodiments, dummy gates 34 includes dummy gate dielectric 30 over fins 22 and 23 (FIG. 3B), and dummy gate electrodes 32 over dummy gate dielectric 30. Dummy gate dielectric 30 may be formed of silicon oxide, and dummy gate electrode 32 may be formed of poly-crystalline silicon (poly-Si). The formation process may include the deposition of dummy gate dielectric 30 and dummy gate electrode 32, and a planarization to level the top surface of dummy gate electrodes 32. In addition, dummy gates 34 may include hard mask 35, which may be formed of silicon oxide or silicon nitride. A photolithography step is then performed to pattern the deposited dummy gate dielectric 30, dummy gate electrode 32, and hard mask 35. Accordingly, the structure shown in FIGS. 3A and 3B is resulted.

Figure 4B:
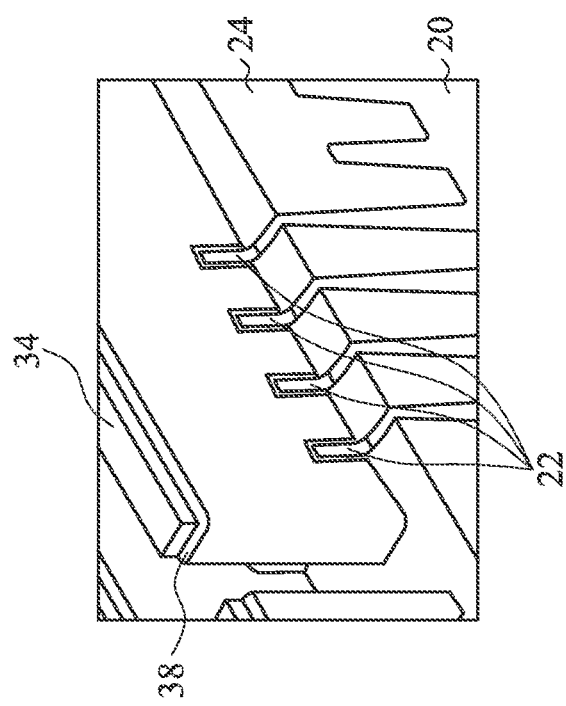
Figure 4A:
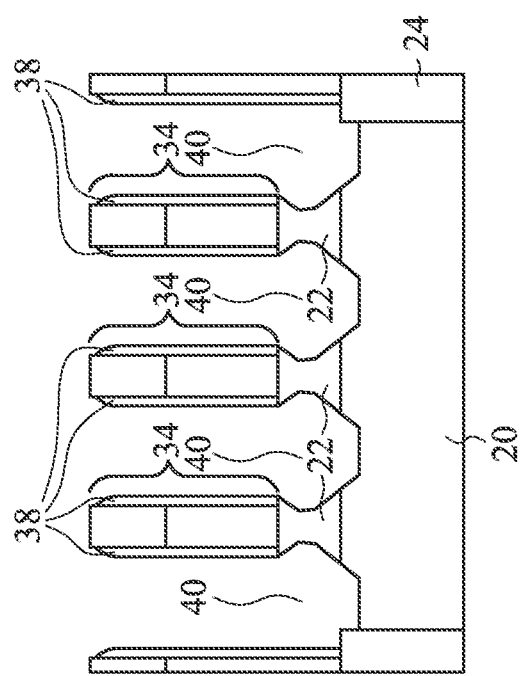

FIGS. 4A, 4B, 5A and 5B illustrate the formation of source and drain regions. The respective step is illustrated as step 208 in the process flow shown in FIG. 20. FIGS. 4A and 4B are cross-sectional view and perspective view, respectively. First, gate spacers 38 are formed on the sidewalls of dummy gates 34. The formation process includes a blanket deposition step followed by a dry etch process. Gate spacers 38 may comprise silicon nitride, silicon carbide, silicon oxynitride, silicon oxide, combinations thereof, or multi-layers thereof.

Figure 5B:
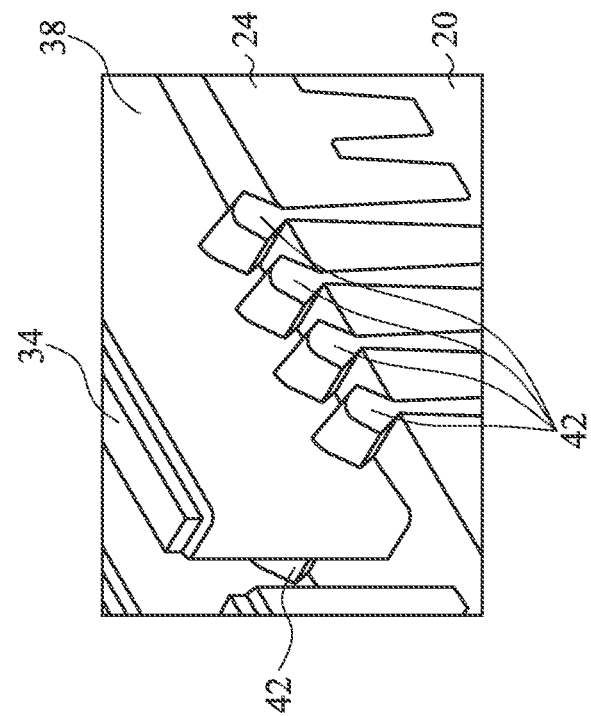
Figure 5A:
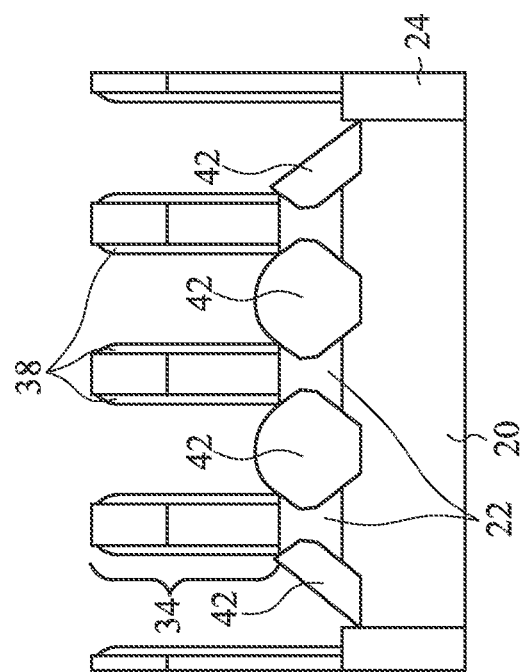

After the formation of gate spacers 38, the exposed fins 22 are recessed through etching, hence forming recesses 40. The resulting structure is also shown in FIGS. 4A and 4B. Next, as shown in FIGS. 5A and 5B, which illustrate a cross-sectional view and a perspective view, respectively, source/drain regions 42 are formed. In accordance with some embodiments of the present disclosure, the formation of source/drain regions 42 (of a p-channel FinFET) is separated from the formation of the source/drain regions (not shown, similar to source/drain regions 42) of n-channel FinFETs. In the epitaxy of source/drain regions 42, a p-type impurity may be in-situ doped with the proceeding of the epitaxy. After the epitaxy, an ion implantation may (or may not) be performed to introduce a p-type impurity or other contact-resistance enhancing species (such as ytterbium, aluminum, tin, etc.) into source/drain regions 42.

Similarly, in the epitaxy of the source/drain regions of n-channel FinFETs, an n-type impurity may be in-situ doped with the proceeding of the epitaxy. After the epitaxy, an ion implantation may (or may not) be performed to introduce an n-type impurity or other contact-resistance enhancing species (such as ytterbium, aluminum, tin, etc.) into the source/drain regions of n-channel FinFETs.

Next, a source/drain dopant activation anneal may be performed, employing rapid thermal annealing (RTA), millisecond anneal (MSA) spike anneal, laser annealing (LSA), or other annealing techniques.

Figure 6A:
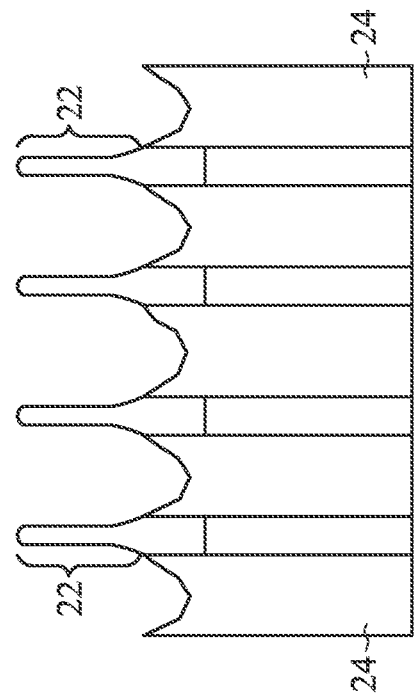
Figure 6B:
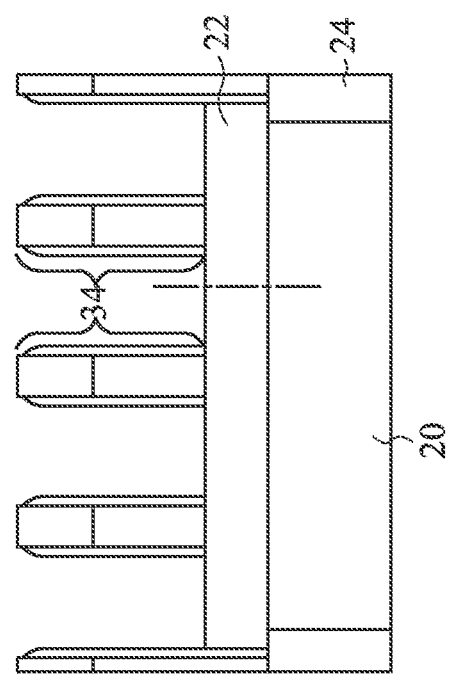
Figure 7B:
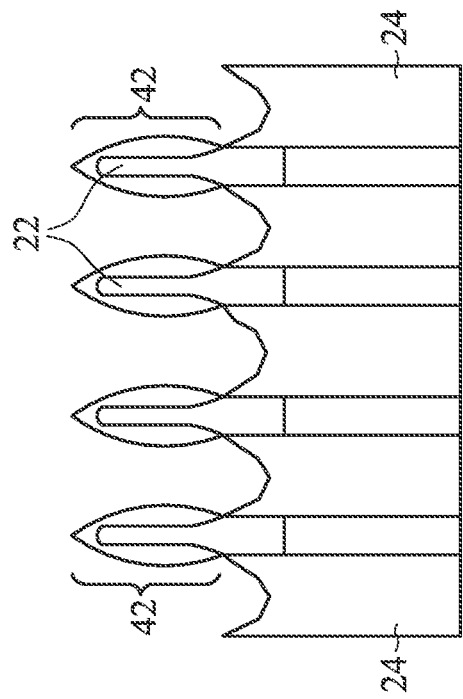
Figure 7A:
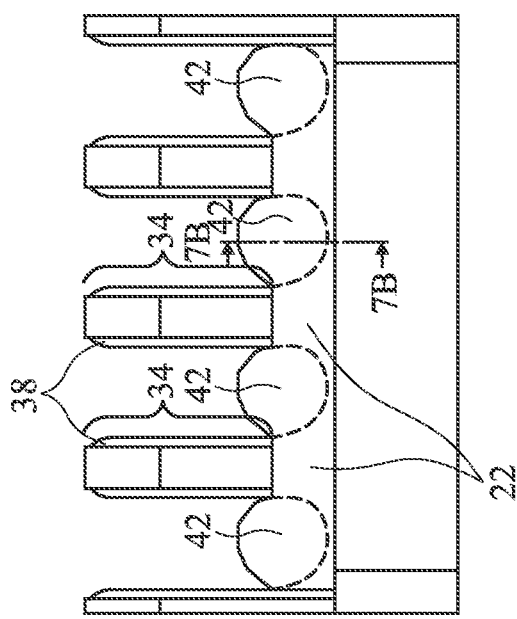

FIGS. 6A, 6B, 7A, and 7B illustrate the formation of source/drain regions 42 and the source/drain regions of n-channel FinFETs in accordance with some embodiments of the present disclosure. These embodiments are similar to the embodiments shown in FIGS. 4A, 4B, 5A and 5B, except that before the epitaxy, fins 22 and 23 are thinned (as shown in FIG. 6B), rather than fully etched. In the thinning process, fins 22 are laterally etched slightly. For example, if the original fin width is 6 nm, the fin width may be reduced by about 1 nm to about 2 nm on each side. After the thinning of fins 22 and 23, source/drain epitaxy processes are performed to finish the formation of source/drain regions 42 and the source/drain regions of n-channel FinFETs, wherein the process details may be the same as discussed referring to FIGS. 6A and 6B. FIG. 7B illustrates a cross-sectional view obtained from the vertical plane containing line 7B-7B in FIG. 7A.

Figure 8:
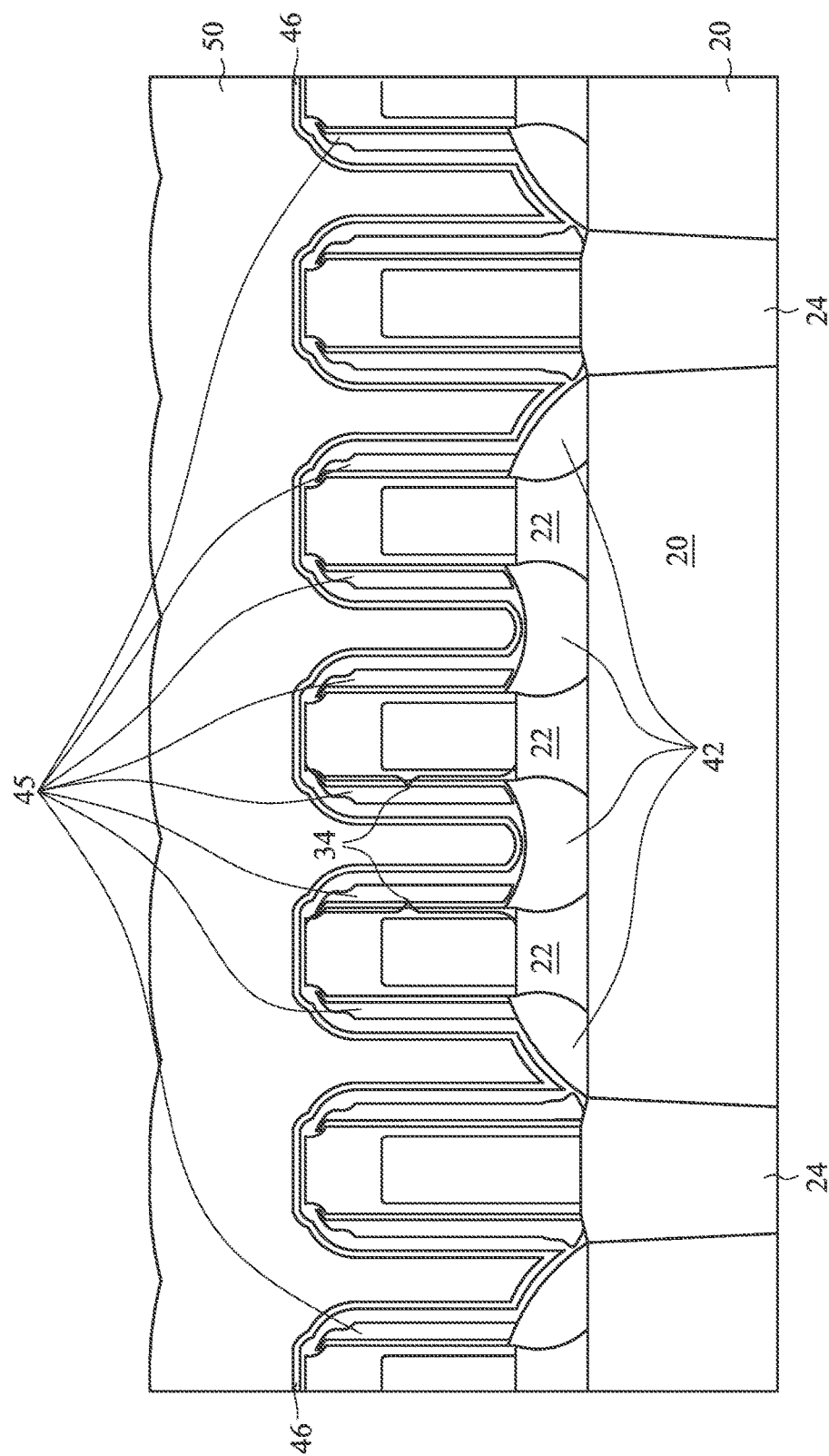

In accordance with some embodiments, main spacers 45 are formed, as shown in FIG. 8. The formation of main spacers 45 may include forming one or a plurality of blanket dielectric layers such as silicon oxide, silicon nitride, or the like, and etching the blanket dielectric layers to remove the horizontal portions of the dielectric layers. The remaining vertical portions of the blanket dielectric layers are the main spacers.

Further referring to FIG. 8, Contact Etch-Stop Layer (CESL) 46 is deposited. CESL 46 may comprise silicon nitride ($Si_3N_4$) having an intrinsic stress with a magnitude of 1 GPa or higher. In accordance with some embodiments of the present disclosure, other dielectric material having an intrinsic stress with a magnitude greater than 1 GPa may also be used. The intrinsic stress is compressive for p-channel FinFETs and tensile for n-channel FinFETs.

Figure 9:
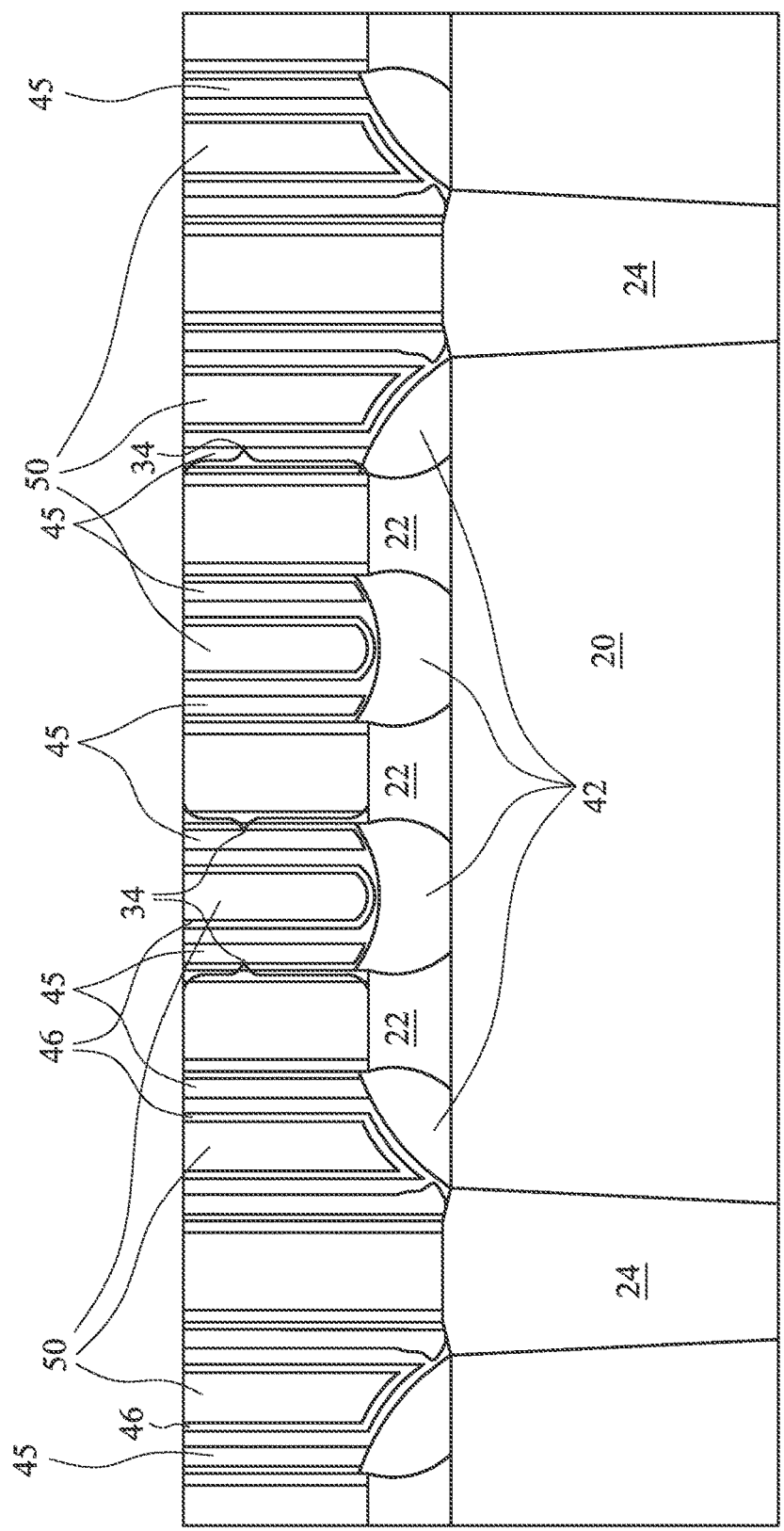
Figure 10:
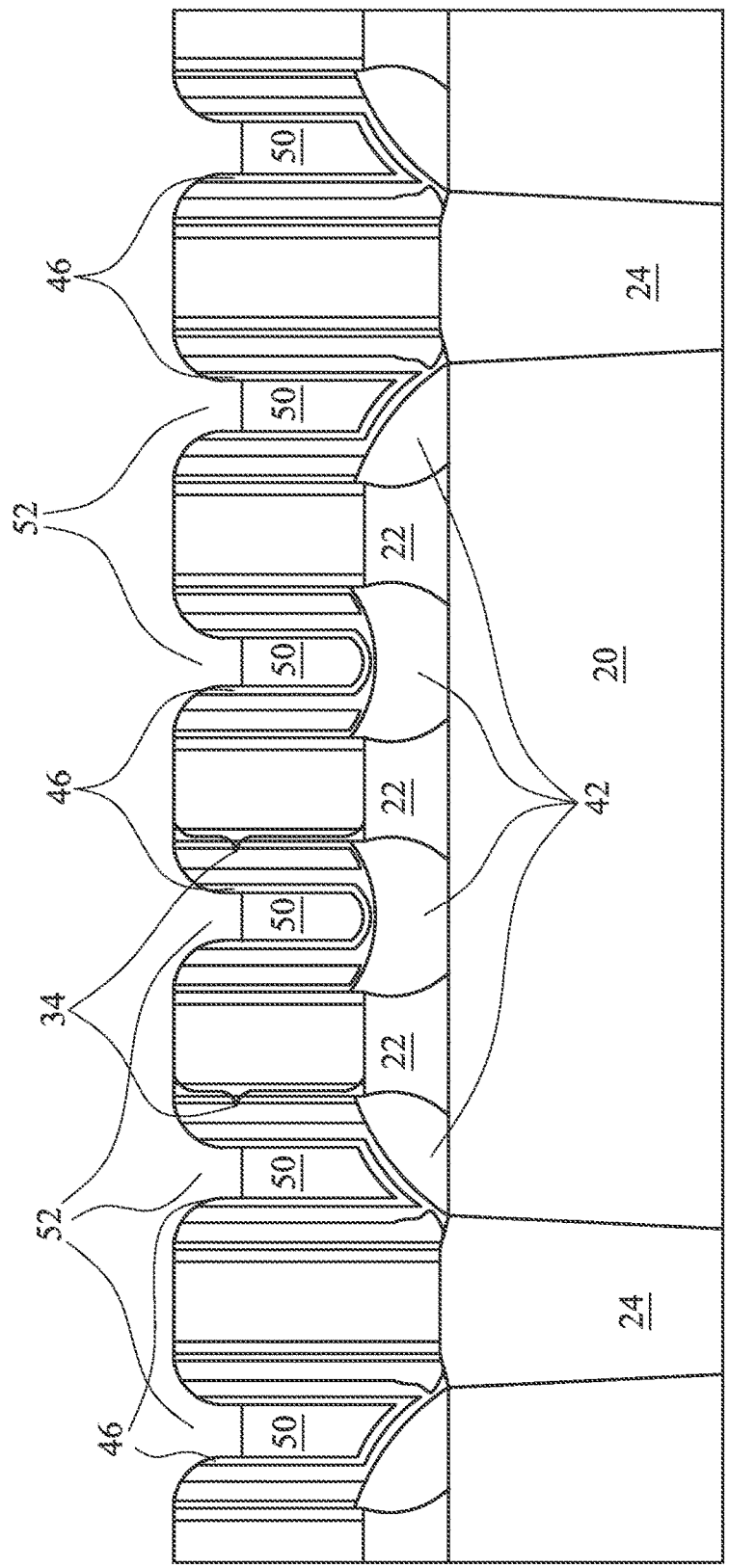
Figure 11:
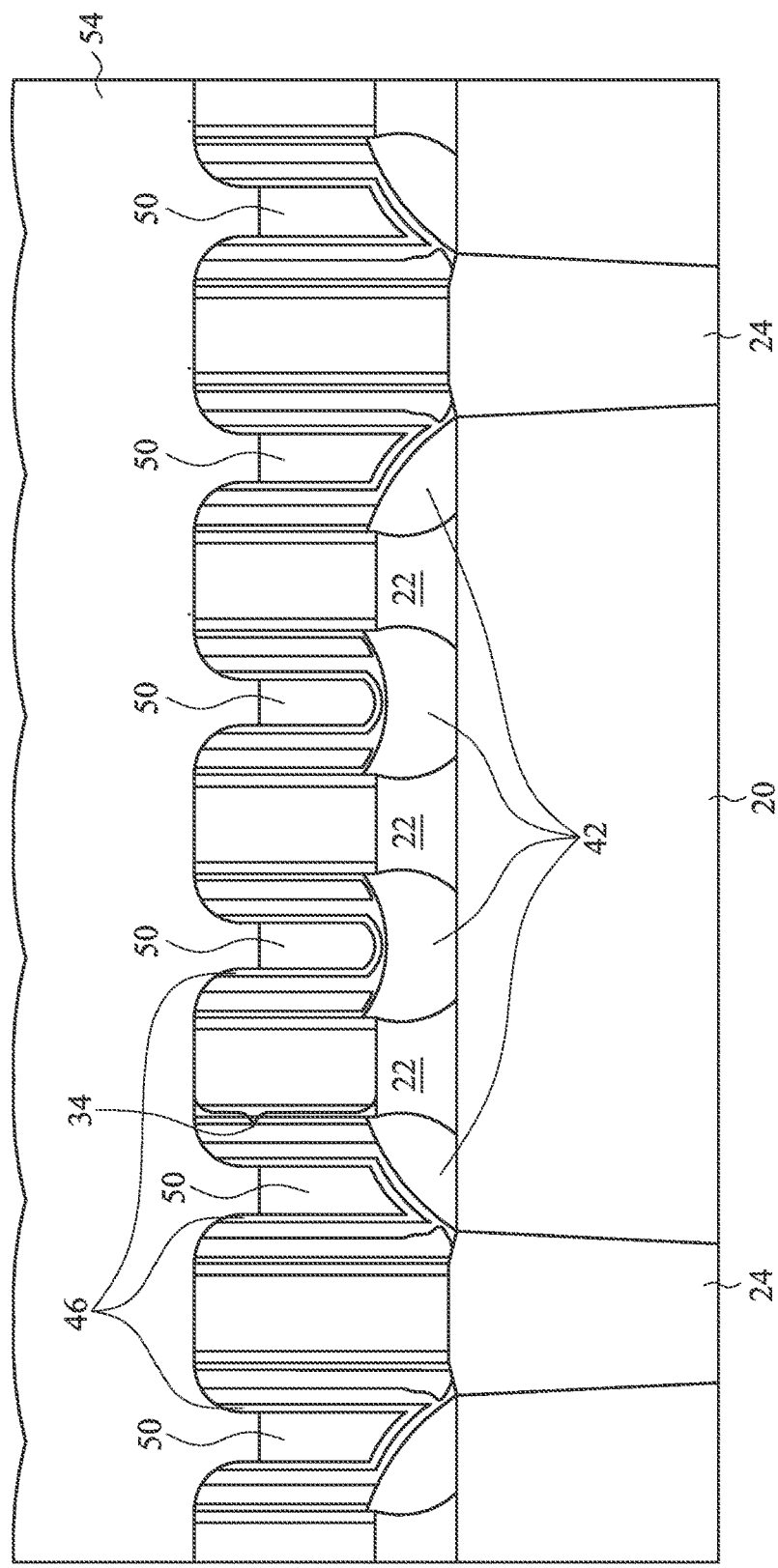
Figure 12A:
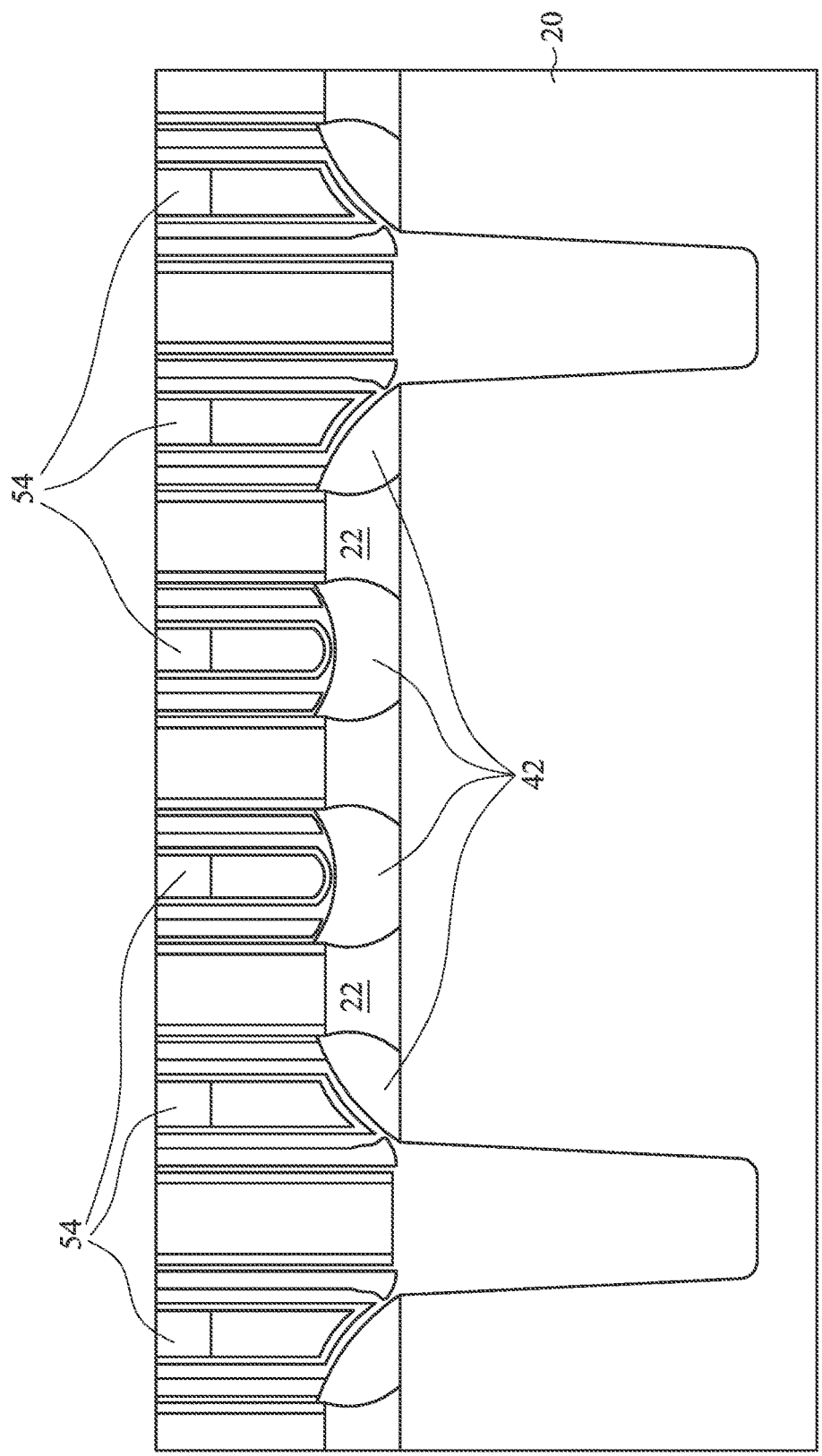

Next, Inter-Layer Dielectric (ILD) 50 is formed. The formation process may comprise the deposition of a flowable CVD dielectric followed by a thermal curing or a ultra-violet radiation curing, so that silicon oxide ($SiO_2$) is formed. A planarization is then performed to planarize the top surface of ILD 50. The resulting structure is shown in FIG. 9. Next, ILD 50 is recessed slightly, so that recesses 52 are formed, as shown in FIG. 10. In subsequent process steps, hard mask 54 is deposited (FIG. 11), followed by a planarization step as shown in FIG. 12A. Hard mask 54 may comprise silicon nitride ($Si_3N_4$), which protects ILD 50 and the underlying structures in the subsequent process steps.

FIG. 12B illustrates a perspective view showing a portion of the structure in FIG. 12A. As shown in FIG. 12B, semiconductor fins 22 are covered by dummy gates 34.

FIGS. 13A through 17C illustrate the cross-sectional views and perspective views of a Replacement Gate (or RPG) process, in which dummy gates 34 (FIGS. 12A and 12B) are replaced with replacement gates. In the following discussion, the replacement of the gate of p-channel FinFET is discussed as an example. The concept of the teaching is readily applicable to the formation of the replacement gate of n-channel FinFETs.

Figure 13A:
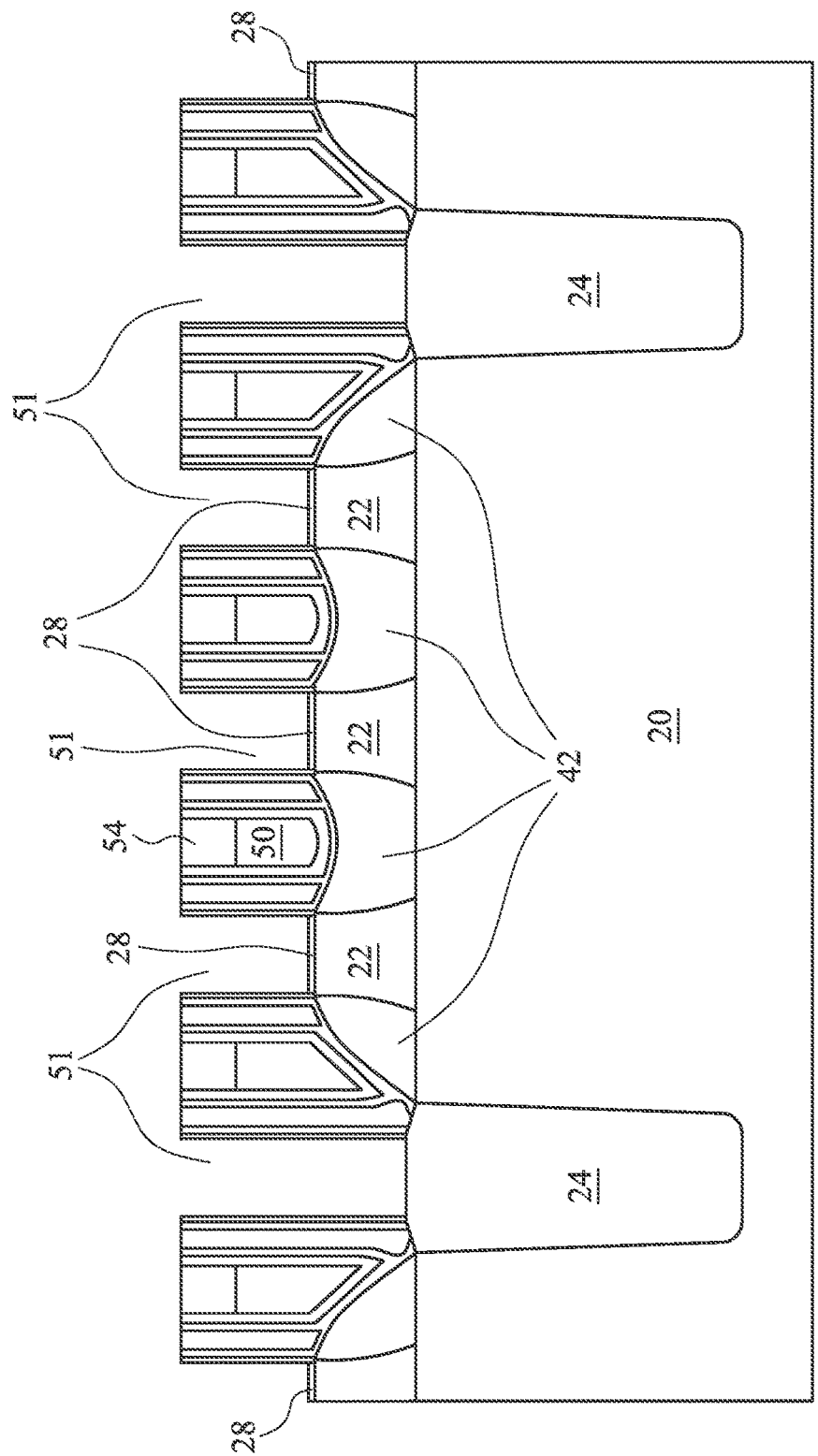
Figure 13B:
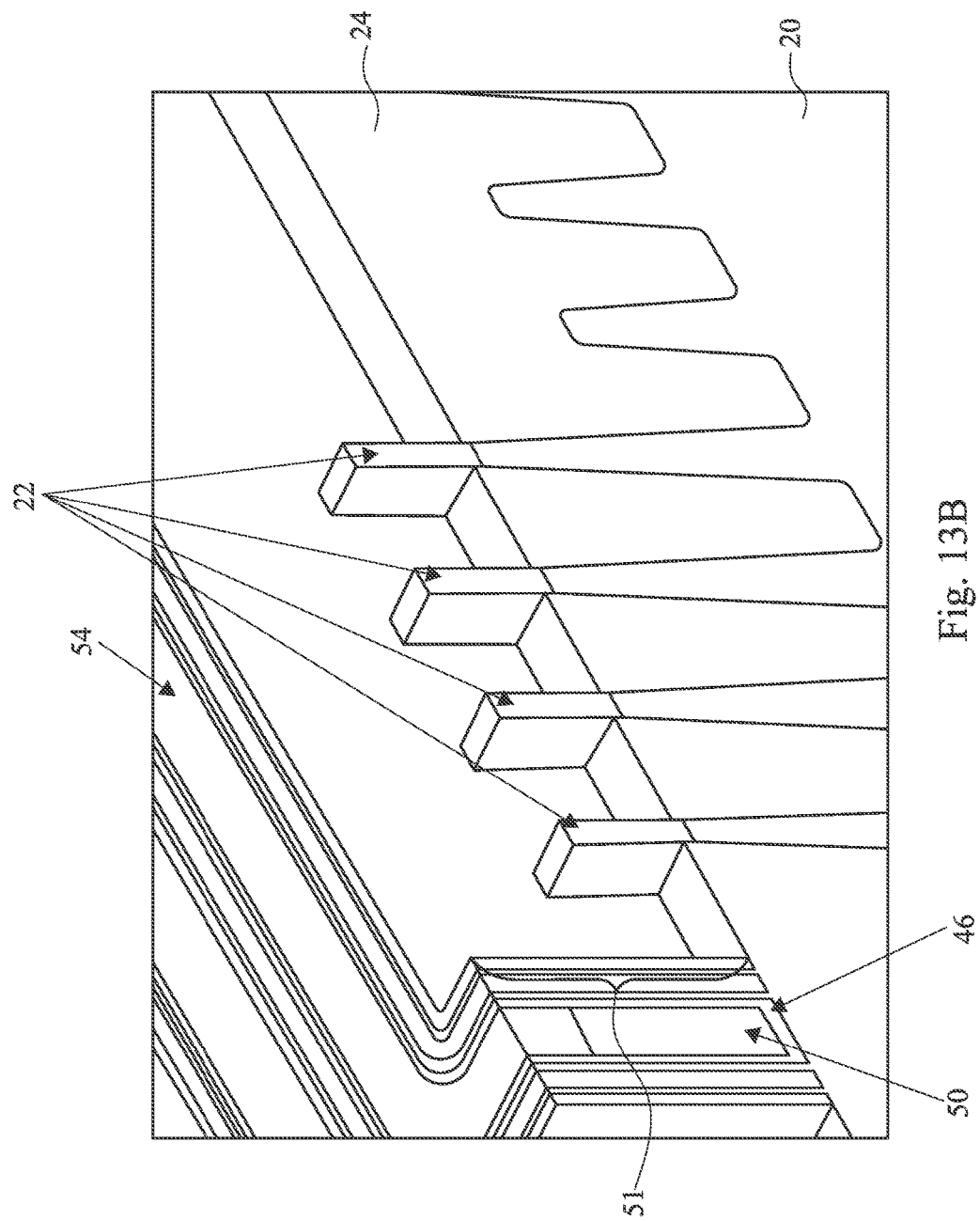

FIGS. 13A and 13B illustrate a cross-sectional view and a perspective view, respectively, in the removal of dummy gates 34 as shown in FIGS. 12A and 12B. Recess 51 is thus formed. The respective step is illustrated as step 210 in the process flow shown in FIG. 20. First, dummy gate electrode 32 and dummy gate dielectric 30 (FIG. 3A) are removed through etching. Accordingly, cap layer 28 as shown in FIG. 3A is exposed. In the embodiments in which cap layer 28 is a crystalline silicon layer, cap layer 28 may be removed or may be kept un-removed. In the embodiments in which cap layer 28 is not form of crystalline silicon, cap layer 28 is removed. The respective step is illustrated as step 212 in the process flow shown in FIG. 20. Removing cap layer 28 advantageously removes any contamination in cap layer 28.

A crystalline silicon cap layer 56 is then epitaxially grown. The respective step is illustrated as step 214 in the process flow shown in FIG. 20. The resulting structure showing the resulting cap layer is shown in FIG. 14, which shows the silicon cap layer as 59, which may include crystalline silicon layer 28 only, crystalline silicon layer 56 only, or crystalline silicon layer 56 on crystalline silicon layer 28. The thickness of crystalline silicon layer 59 may range from 1 atomic layer (about 0.136 nm) to about 20 atomic layers (about 2.7 nm). In accordance with some exemplary embodiments, the thickness of silicon layer 59 is less than 10 atomic layer (about 1.36 nm) thick.

In some embodiments in which silicon cap 59 is epitaxially grown in the RPG process segment, it may be grown on both SiGe fins 22 (for p-channel devices) as well as the silicon fins 23 (for n-channel devices, FIG. 3B). Alternatively, silicon cap 59 may be grown on SiGe fins 22, but not on silicon fins 23, which will be covered by a hard mask such as $SiO_2$ to prevent the epitaxy of cap layer 59 from being formed on silicon fins 23.

Figure 15A:
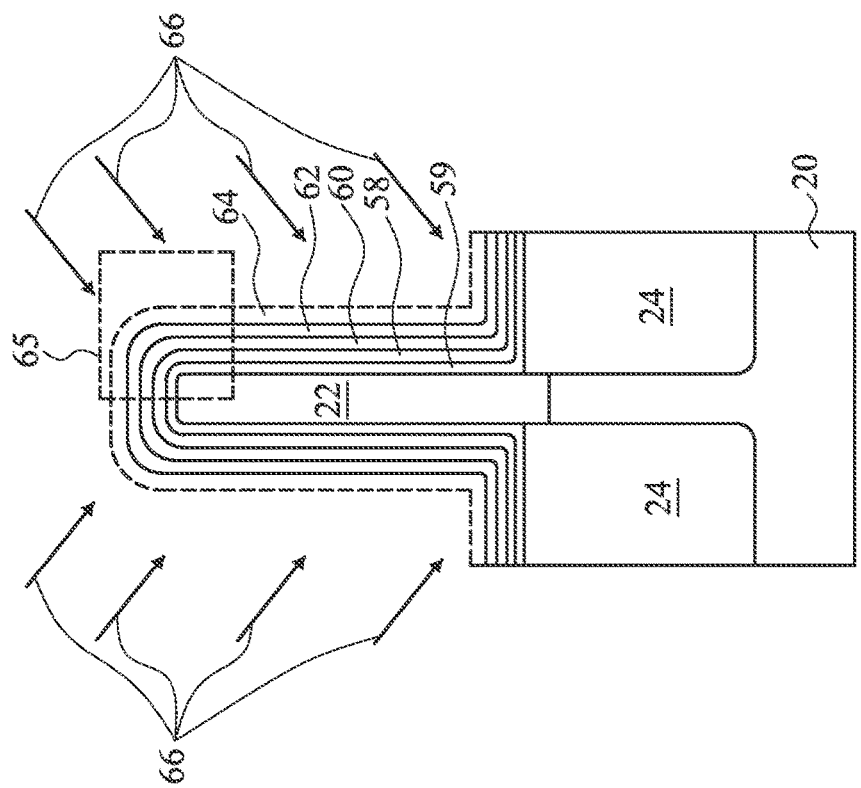
Figure 15B:
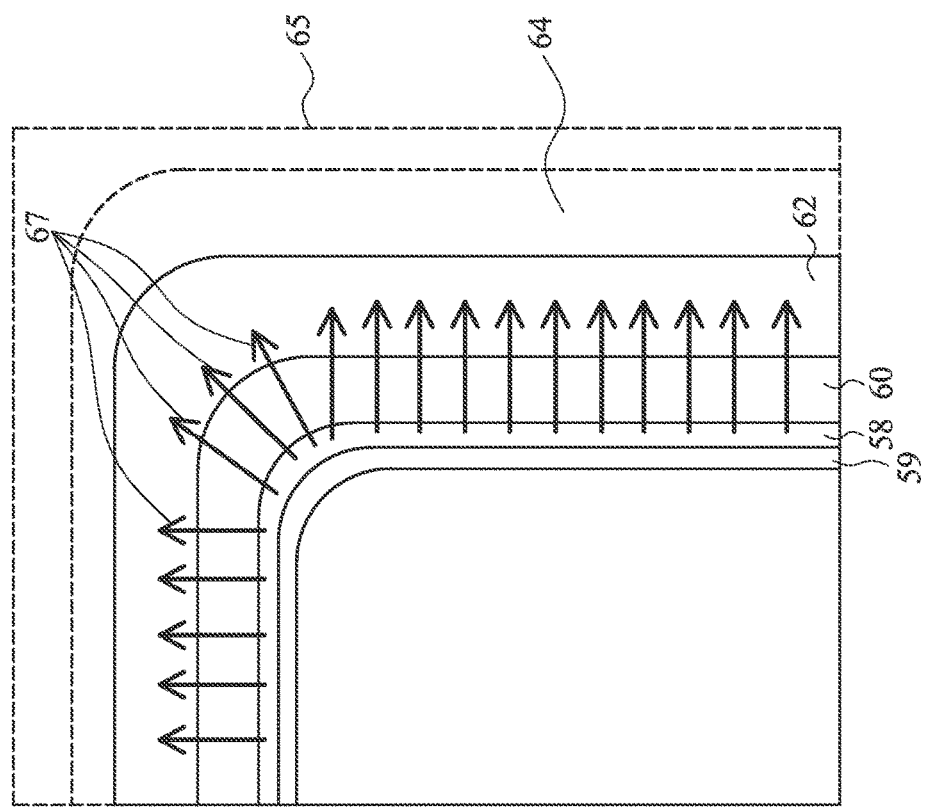
Figure 16:
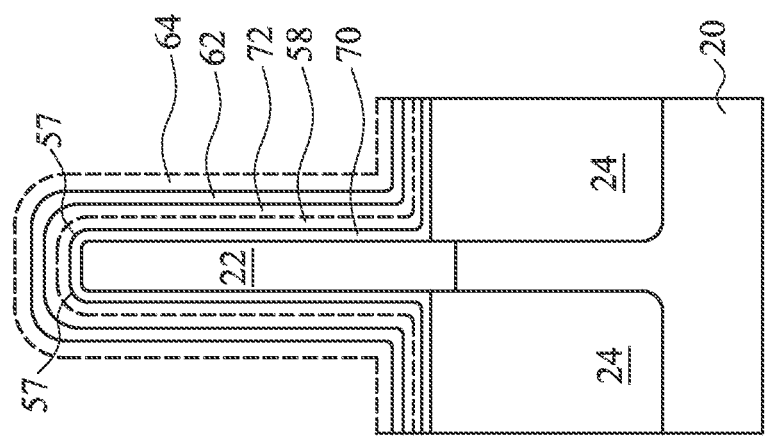

Crystalline silicon layer 59 has the advantageous features of blocking germanium atoms in SiGe fins 22 from diffusing outwardly into the subsequently formed high-k dielectric material to form undesirable compounds. In addition, crystalline silicon layer 59 also prevents germanium from reacting with the oxygen in the subsequently formed interfacial layer (such as silicon oxide) to form undesirable germanium oxide. However, at corners 57 (FIG. 14), crystalline silicon layer 59 maybe much thinner than in other locations such as the vertical and horizontal portions of crystalline silicon layer 59. This results in the blocking ability of crystalline silicon layer 59 to be compromised. FIGS. 15A, 15B, and 16 illustrate an oxygen scavenging process for increasing the thickness of crystalline silicon at corners 57.

After the structure as shown in FIG. 14 is formed, a surface cleaning is performed, for example, using diluted HF solution. Next, as shown in FIG. 15A, interfacial layer 58 is formed on crystalline silicon layer 59. The respective step is illustrated as step 216 in the process flow shown in FIG. 20. Interfacial layer 58 is formed of silicon oxide, which may be formed by plasma-enhanced atomic layer deposition. Alternatively, interfacial layer 58 may be formed by CVD, thermal oxidation using water steam ($H_2O$) or $O_2$, or gas phase or liquid phase chemical oxidation using an oxidizing agent such as hydrogen peroxide ($H_2O_2$) or ozone ($O_3$). The thickness of interfacial layer 58 may be less than 1 nm.

Next, high-permittivity (high-k) gate dielectric 60 is formed on interfacial layer 58. The respective step is also illustrated as step 216 in the process flow shown in FIG. 20. In accordance with some embodiments of the present disclosure, high-k gate dielectric 60 is formed of hafnium oxide ($HfO_2$), for example, by using ALD. High-k gate dielectric 60 may also comprise zirconium oxide ($ZrO_2$), lanthanum oxide ($La_2O_3$), titanium oxide ($TiO_2$), yttrium oxide ($Y_2O_3$), strontium titanate ($SrTiO_3$), or combinations thereof. The physical thickness of the high-k gate dielectric 60 may be in the range between about 1.0 nm and about 10 nm.

Oxygen-scavenging metal layer 62 is deposited on high-k gate dielectric 60. The respective step is illustrated as step 218 in the process flow shown in FIG. 20. Scavenging metal layer 62 has a higher affinity for oxygen than the metal in the metal-oxide (in high-k gate dielectric 60) and silicon (in interfacial layer 58). Scavenging metal layer 62 may include a metal or a metal compound such as Ti, Hf, Zr, Ta, Al, TiN, TaN, TaSiN, TiSiN, or combinations thereof such as TiAl. Scavenging metal layer 62 may also be formed of a metal nitride (e.g. TiN or TaN), or a nitride of a metal alloy such as TiAlN. The deposition methods include physical vapor deposition, CVD, or ALD. Scavenging metal layer 62 has the function of scavenging oxygen from interfacial layer 58 at elevated temperatures.

In accordance with some embodiments of the present disclosure, scavenging-metal-capping layer 64 is formed on top of scavenging metal layer 62 to prevent the oxidation of scavenging metal layer 62, wherein the oxidation may occur before, during, or after the subsequent scavenging anneal. Scavenging-metal-capping layer 64 may comprise another metal or metal compound such as TiN, TiSiN, TaN, TaSiN. Alternatively, scavenging-metal-capping layer 64 is a silicon layer. Scavenging-metal-capping layer 64 and scavenging metal layer 62 are formed of different materials, although some of their candidate materials may be the same. In alternative embodiments, no scavenging-metal-capping layer is formed.

Next, a scavenging anneal process (represented by arrow 66 in FIG. 15A) is performed to initiate and enable the scavenging. The respective step is also illustrated as step 218 in the process flow shown in FIG. 20. The scavenging anneal may be performed using spike annealing, with the time duration being milliseconds, for example, between about 10 milliseconds and about 500 milliseconds. The temperatures of the respective wafer may be in the range between about 400° C. and about 1,100° C. In accordance with some exemplary embodiments, the temperature is in the range between about 700° C. and about 1,000° C.

The oxygen scavenging process chemically reduces interfacial layer 58, and interfacial layer 58 has a reduced thickness or may be eliminated (fully converted). The scavenging process deprives oxygen from at least the bottom portion of interfacial layer 58, and hence the silicon in interfacial layer 58 remains to form an additional silicon layer on top of crystalline silicon layer 59. FIG. 15B illustrates a magnified view of portion 65 in FIG. 15A. Arrows 67 are shown in FIG. 15B to indicate the movement of oxygen atoms due to the scavenging. Accordingly, as shown in FIG. 16, crystalline (or polycrystalline/amorphous) silicon layer 70 is formed, which includes crystalline silicon layer 59 and the additional silicon layer on top of crystalline silicon layer 59. The additional silicon layer is formed of the remaining silicon of interfacial layer 58 after oxygen is scavenged from the bottom portion of interfacial layer 58. The middle portion of interfacial layer 58 may remain after the scavenging process, or alternatively, no interfacial layer 58 remains after the scavenging. In the resulting structure in FIG. 16, the remaining interfacial layer 58 is shown using dashed lines to indicate that it may or may not exist after the scavenging anneal.

Advantageously, the formation of a silicon layer as a result of the scavenging is enhanced by the presence of silicon cap layer 59 underlying the interfacial layer 58, and the thickness uniformity of the resulting silicon layer is improved. At corners 57, the epitaxially grown silicon cap layer 59 may be thin, and germanium segregation issues may be severe at corners 57. In some embodiments of the present disclosure, the thickness of silicon layer is increased due to the scavenging process, and hence the blocking ability of the silicon cap layer is improved. Particularly, the increase in the thickness of the silicon cap layer at corners 57 significantly improves the blocking ability of the silicon cap layer and reduces germanium segregation at corners 57.

During the scavenging anneal process, high-k gate dielectric 60 may intermix with the top portion of interfacial layer 58 and the oxygen scavenged from the bottom portion of interfacial layer 58 to form an intermix compound, which may be a metal silicate. Layer 72 is illustrated to represent the intermix compound and the remaining high-k gate dielectric 60 (if any), which is likely to have increased oxygen content. For example, when high-k gate dielectric 60 comprises $HfO_2$, intermix compound 72 comprises hafnium silicate ($HfSiO_4$). When high-k gate dielectric 60 comprises $ZrO_2$, intermix compound 72 comprises zirconium silicate ($ZrSiO_4$).

After the scavenging process, scavenging-metal-capping layer 64 may be removed by etching. Scavenging metal layer 62 may also be removed, or may be left un-removed. The respective removal step is illustrated as step 220 in the process flow shown in FIG. 20. In the embodiments in which the fin pitch is very smaller, such as smaller than about 24 nm, scavenging metal layer 62 is more likely to be removed to improve the subsequent metal filling. In accordance with alternative embodiments, scavenging metal layer 62 is not removed.

Figure 17A:
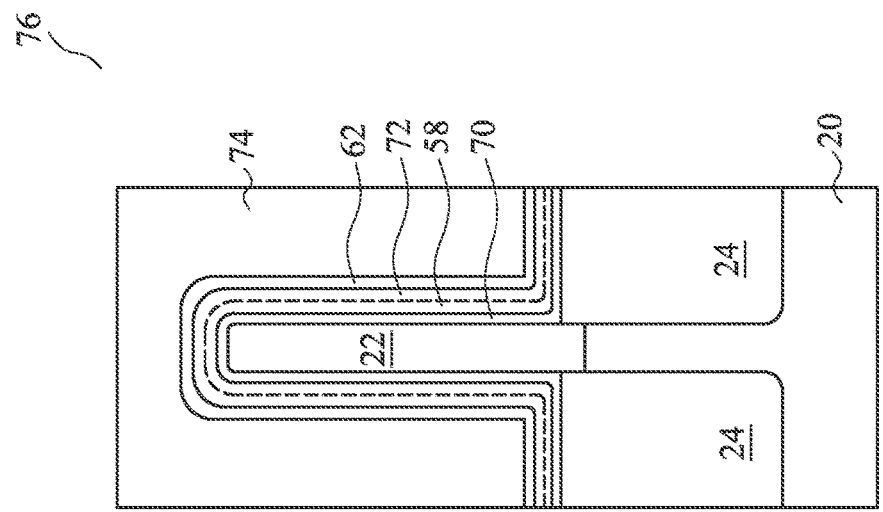
Figure 17B:
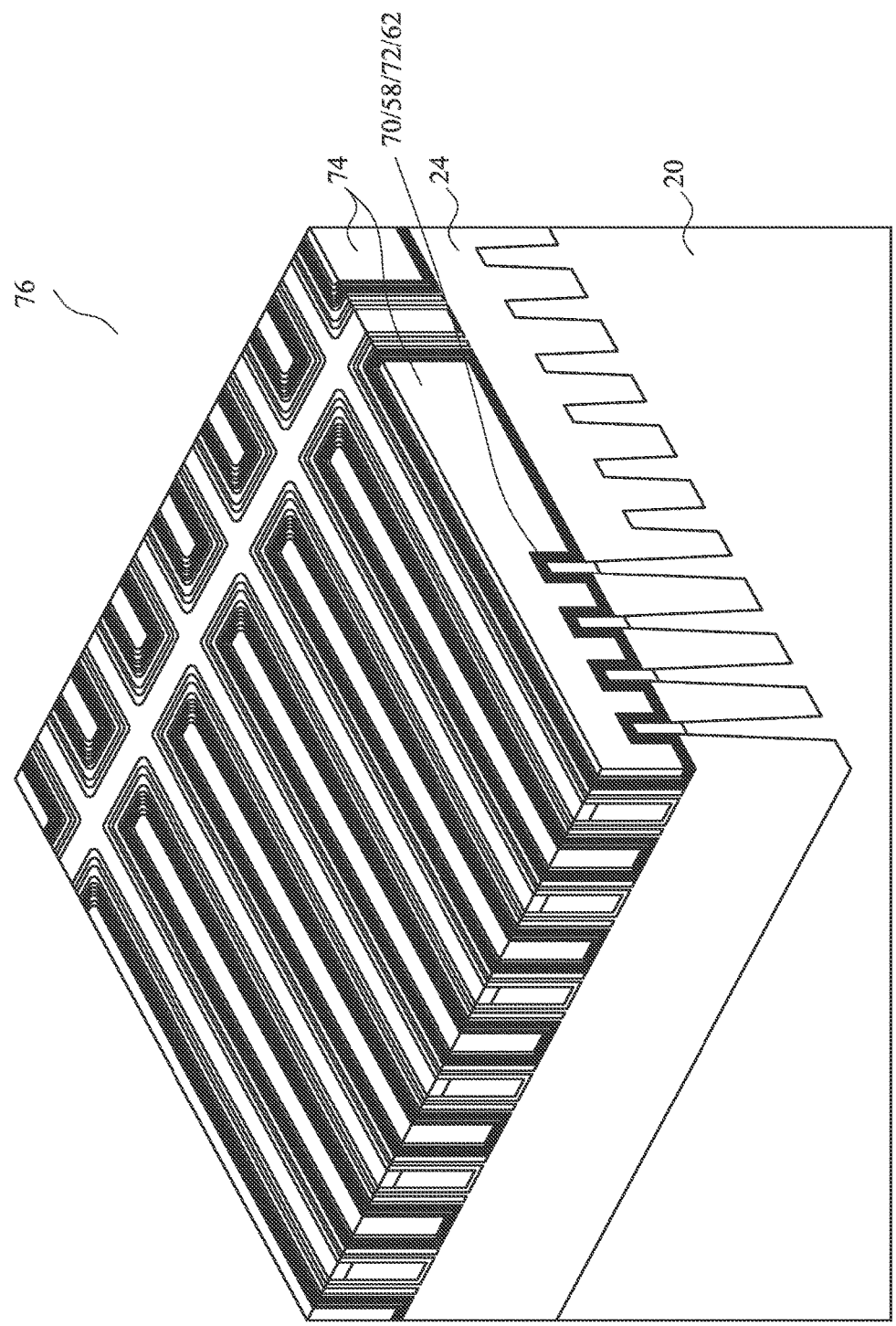
Figure 17C:
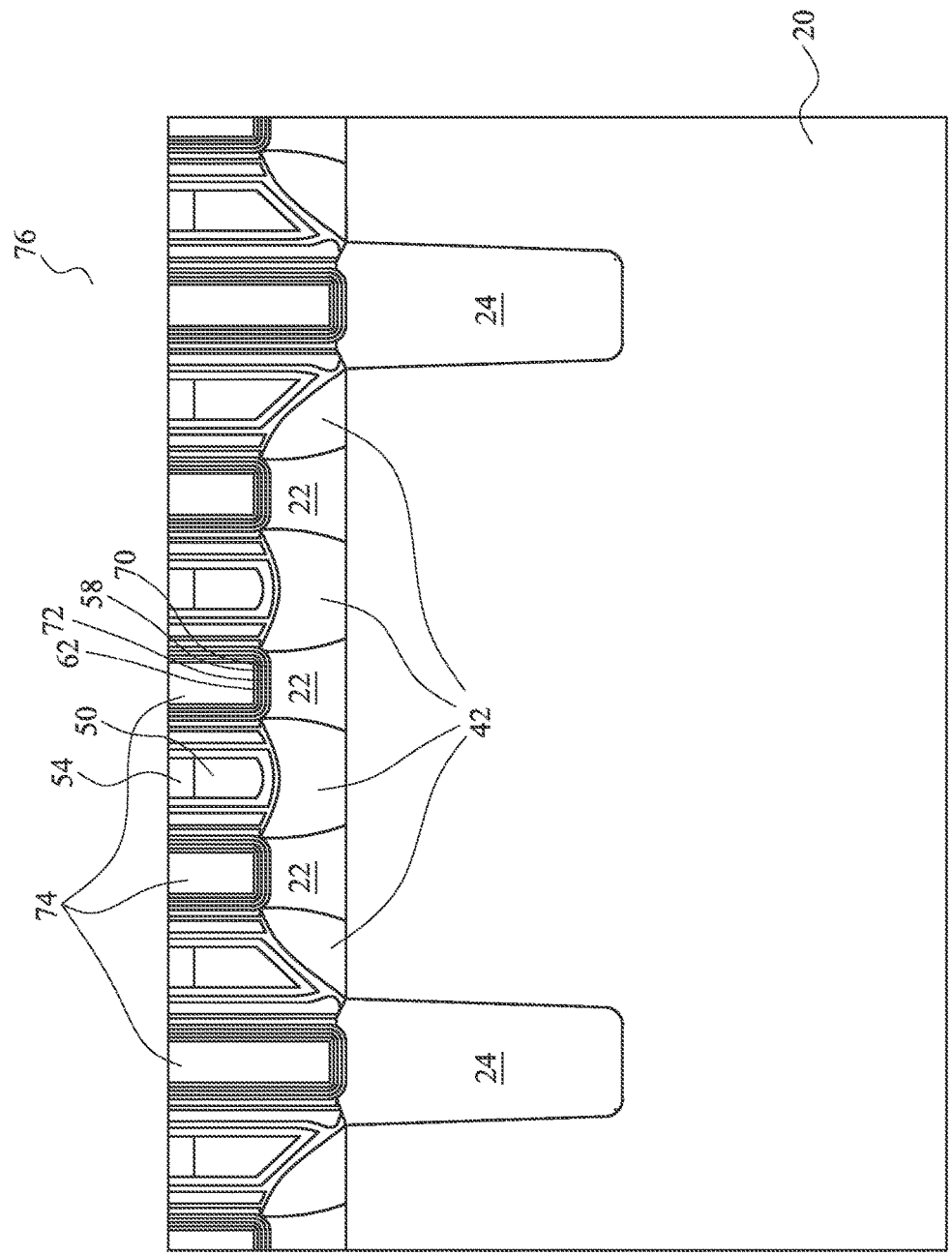

Next, as shown in FIGS. 17A, 17B, and 17C, a metal filling process is performed to form replacement metal gate 74. The respective step is illustrated as step 222 in the process flow shown in FIG. 20. An n-type metal stack (for n-channel transistor) and a p-type metal stack (for p-channel transistor) may be formed independently, depending on the type of the resulting FinFET, in order to allow independent optimization of the electrical performance of the n-channel and p-channel FinFETs. Metal stack 74 may include a work function layer, a barrier layer, and a filling metal layer (not shown). The n-type metal work function layer comprises a metal with sufficiently low effective work function, selected from but not restricted to the group of titanium, aluminum, tantalum carbide, tantalum carbide nitride, tantalum silicon nitride, or combinations thereof. The p-type metal work function layer comprises a metal with a sufficiently large effective work function, selected from but not restricted to the group of titanium nitride, tantalum nitride, ruthenium, molybdenum, tungsten, platinum, or combinations thereof. The filling metal layer may include aluminum, tungsten, copper, or other conductive metals. A chemical mechanical polishing step is then performed to planarize the various metal layers, and to provide a substantially planar surface for forming a multi-layer interconnection. FIGS. 17A, 17B, and 17C illustrate a cross-sectional view in channel-width direction, a perspective view, and a cross-sectional view in channel-length direction, respectively, of the resulting FinFET 76. Next, contact plugs (not shown) may be formed. The respective step is illustrated as step 224 in the process flow shown in FIG. 20.

Figure 18:
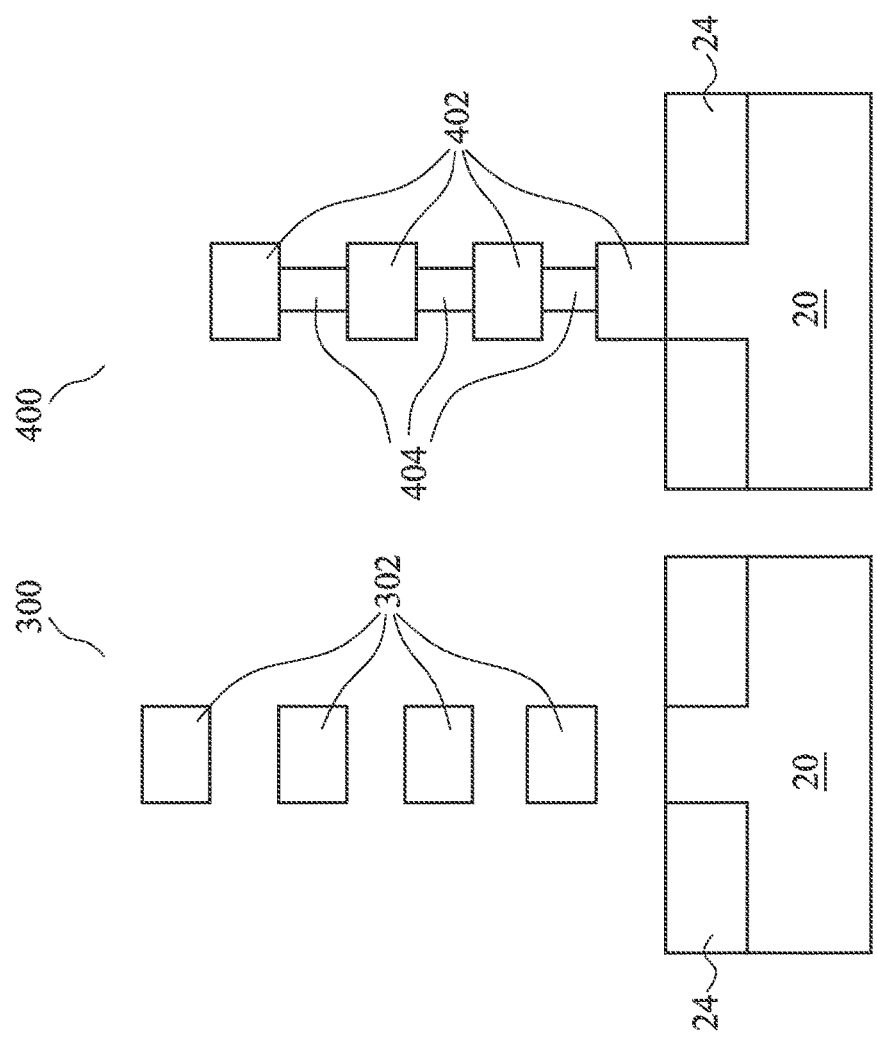
FIGS. 18 and 19 illustrate the cross-sectional views of Metal-Oxide Semiconductor Field-Effect Transistors (MOSFETs) having nanowires in accordance with some embodiments.
Figure 19:
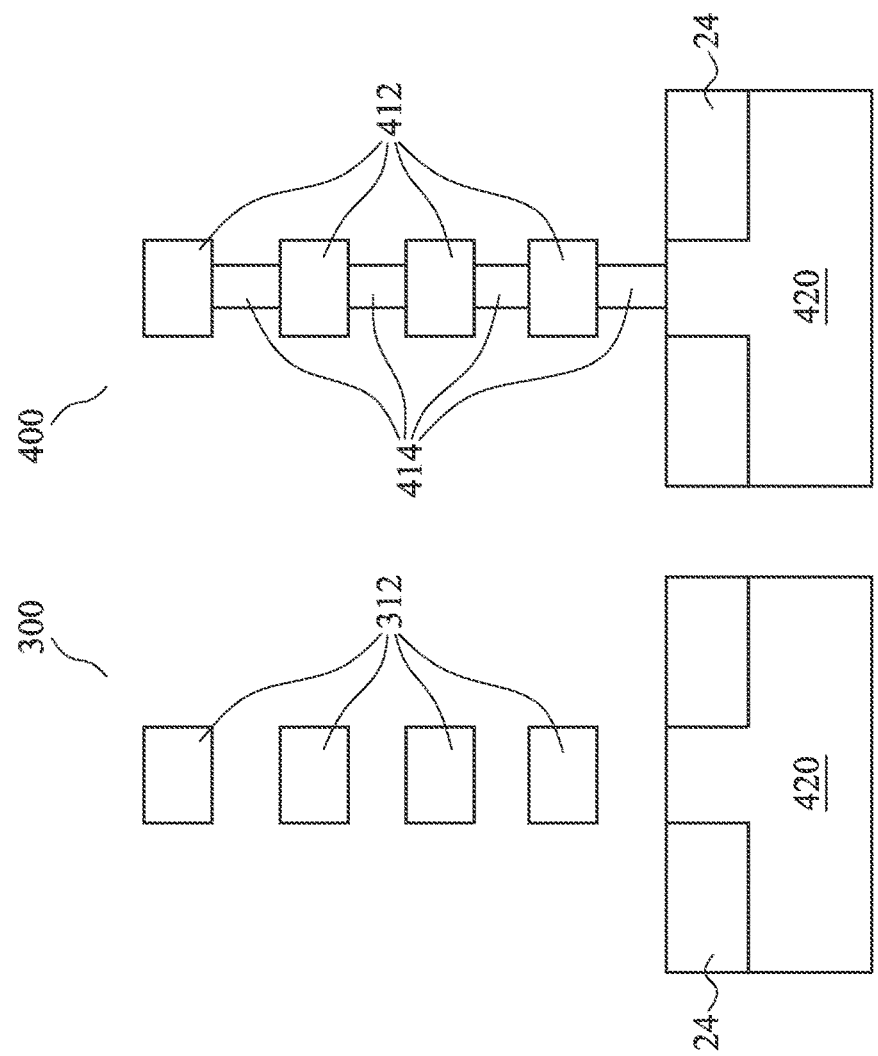

FIGS. 18 and 19 illustrate two structures that can be applied with the teaching of the present disclosure. In FIG. 18, NMOS device 300 includes a plurality of silicon nanowires 302 that may be used to form a gate-all-around transistor. It is noted that although nanowires 302 are illustrated as suspended, they are actually supported on opposite ends, which are not in the illustrated plane. PMOS device 400 includes SiGe nanowires 402 and silicon nanowires 404 stacked in an alternating layout, with silicon nanowires 404 having a reduced width than SiGe nanowires 402. Nanowires 302, 402 and 404 are formed over silicon substrate 20.

In FIG. 19, NMOS device 300 includes a plurality of germanium nanowires 312 (which may be free from silicon) that may be used to form a gate-all-around transistor. PMOS device 400 includes germanium nanowires 422 and SiGe nanowires 414 stacked in an alternating layout, with silicon nanowires 404 having a reduced width than SiGe nanowires 402. Nanowires 312, 412 and 414 are formed over SiGe substrate 420.

As shown in FIGS. 18, and 19, nanowires have a plurality of corners that may suffer from thin silicon capping layer and germanium segregation. Accordingly, the concept of the present disclosure may be adopted, with the silicon cap layer 70 as shown in FIG. 16 formed wrapping around nanowires 302, 402 and 404 (FIG. 18) and nanowires 312, 412 and 414 (FIG. 19) using the methods of the present disclosure.

The embodiments of the present disclosure have some advantageous features. By using oxygen scavenging to increase the thickness of the existing crystalline silicon layer, the thickness of the thin corner portions of the silicon layer is increased, and the germanium segregation problem is prevented.

In accordance with some embodiments of the present disclosure, a method includes forming a silicon cap layer on a semiconductor fin, forming an interfacial layer over the silicon cap layer, forming a high-k gate dielectric over the interfacial layer, and forming a scavenging metal layer over the high-k gate dielectric. An anneal is then performed on the silicon cap layer, the interfacial layer, the high-k gate dielectric, and the scavenging metal layer. A filling metal is deposited over the high-k gate dielectric.

In accordance with alternative embodiments of the present disclosure, a method includes forming a crystalline silicon cap layer on a silicon germanium fin, forming a silicon oxide layer over the silicon cap layer, forming a high-k gate dielectric over the silicon oxide layer, forming a scavenging metal layer over the high-k gate dielectric, and scavenging oxygen from a bottom portion of the silicon oxide layer to convert the bottom portion into a silicon layer, with the silicon layer continuously joined with the crystalline silicon cap layer. After the scavenging, a filling metal is deposited over the high-k gate dielectric.

In accordance with alternative embodiments of the present disclosure, a method includes forming a dummy gate stack on a middle portion of a silicon germanium fin, forming source/drain regions on opposite sides of the silicon germanium fin, forming an inter-layer dielectric over the source/drain regions, with the dummy gate stack in the inter-layer dielectric, removing the dummy gate stack to form a recess in the inter-layer dielectric, and epitaxially growing a silicon cap layer in the recess, with the silicon cap layer being on the silicon germanium fin. A silicon oxide layer is deposited over and contacting the silicon cap layer. A high-k gate dielectric is formed over the silicon oxide layer. A scavenging metal layer is formed over the high-k gate dielectric. The scavenging metal layer has a first affinity for oxygen higher than a second affinity of a metal in the high-k gate dielectric and a third affinity of silicon. An anneal is performed to scavenge oxygen from at least a bottom portion of the silicon oxide layer to convert the bottom portion into a silicon layer. After the anneal, a metal is filled into the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a semiconductor substrate;
   an isolation region extending into the semiconductor substrate;
   a silicon germanium fin adjacent to, and protruding higher than, the isolation region;
   a gate stack comprising:
      a silicon layer on a top surface and sidewalls of the silicon germanium fin, wherein the silicon layer comprises:
         a crystalline silicon layer; and
         an amorphous silicon layer over the crystalline silicon layer;
      a high-k gate dielectric layer over the silicon layer;
      an oxygen-scavenging metal layer over the high-k gate dielectric layer;
      a work-function metal layer over the oxygen-scavenging metal layer, wherein the work-function metal layer has a work function of a respective transistor, with the transistor having the silicon germanium fin as a channel; and
      a filling metal over the work-function metal layer; and
   a metal feature overlapping the isolation region, wherein in a cross-sectional view of the device, the metal feature extends below a bottom end of the oxygen-scavenging metal layer, and the metal feature comprises:
      a lower layer formed of a same material as the work-function metal layer; and
      an upper layer formed of a same material as the filling metal.

2. The device of claim 1, wherein the oxygen-scavenging metal layer comprises a material selected from the group consisting essentially of Ti, Hf, Zr, Ta, Al, TiN, TaN, TaSiN, TiSiN, and combinations thereof.

3. The device of claim 2, wherein the oxygen-scavenging metal layer comprises TiAl.

4. The device of claim 1, wherein the oxygen-scavenging metal layer further comprises oxygen.

5. The device of claim 1, wherein the metal feature further extends to a level lower than a bottom end of the gate stack.

6. The device of claim 1, wherein the oxygen-scavenging metal layer comprises TiSiN or TaSiN.

7. A device comprising:
   a semiconductor substrate;
   an isolation region extending into the semiconductor substrate;
   a semiconductor fin adjacent to, and protruding higher than, the isolation region;
   a gate stack comprising:
      a silicon layer on a top surface and sidewalls of the semiconductor fin;
      a high-k gate dielectric layer over the silicon layer;
      an intermix compound of the high-k gate dielectric layer, silicon, and oxygen, wherein the intermix compound is between the silicon layer and the high-k gate dielectric layer, and the silicon layer comprises a crystalline layer comprising:
         a bottom surface contacting the semiconductor fin; and
         a top surface contacting the intermix compound;
      a filling metal over the high-k gate dielectric layer, wherein the filling metal has a work function of a respective transistor, with the transistor having the semiconductor fin as a channel;
      an oxygen-scavenging metal layer over the high-k gate dielectric layer, wherein the oxygen-scavenging metal layer comprises oxygen and a metal; and
   a metal feature overlapping the isolation region, wherein in a cross-sectional view of the device, the metal feature extends to a level lower than a bottom end of the gate stack, and has a portion at a same level as the gate stack.

8. The device of claim 7, wherein the oxygen-scavenging metal layer comprises a material selected from the group consisting essentially of Ti, Hf, Zr, Ta, Al, TiN, TaN, TaSiN, TiSiN, and combinations thereof.

9. The device of claim 8, wherein the oxygen-scavenging metal layer comprises TiAl.

10. The device of claim 7, wherein:
    the silicon layer comprises:
       a crystalline silicon layer over and contacting the semiconductor fin; and
       an amorphous silicon layer over and contacting the crystalline silicon layer.

11. The device of claim 10, wherein a top surface of the amorphous silicon layer contacts the intermix compound.

12. The device of claim 7 further comprising a plurality of U-shaped layers having bottom portions underlying the metal feature, wherein the bottom portions overlap the isolation region.

13. The device of claim 7, wherein a top surface of the metal feature is coplanar with a top surface of the gate stack.

14. A device comprising:
    a semiconductor substrate;
    an isolation region extending into the semiconductor substrate;
    a semiconductor fin adjacent to, and protruding higher than, the isolation region, wherein the semiconductor fin comprises silicon germanium;
    a gate stack on a top surface and sidewalls of the semiconductor fin, wherein a top surface of the semiconductor fin and a bottom surface of the gate stack have a first interface, and the gate stack comprises:
       a silicon layer over and contacting the semiconductor fin; and
       a high-k gate dielectric layer over the silicon layer;
    an intermix compound between the silicon layer and the high-k gate dielectric layer, with the intermix compound being a compound of the high-k gate dielectric layer, silicon, and oxygen; and a multi-layer stack overlapping the isolation region, wherein a bottom surface of the multi-layer stack contacts a top surface of the isolation region to form a second interface, and the second interface is lower than the first interface.

15. The device of claim 14, wherein the multi-layer stack comprises a plurality of layers, with a middle portion of the multi-layer stack comprises a metallic feature, and the metallic feature has a bottom lower than the first interface.

16. The device of claim 15, wherein the multi-layer stack comprises a plurality of U-shaped layers having U-shaped cross-sectional views in a cross-sectional view of the multi-layer stack, wherein bottom portions of the plurality of U-shaped layers are overlapped by the metallic feature.

17. The device of claim 14, wherein the silicon layer comprises a crystalline silicon layer comprising:

a bottom surface contacting the semiconductor fin; and
a top surface contacting the intermix compound.

18. The device of claim 14, wherein the silicon layer comprises:

a crystalline silicon layer contacting the semiconductor fin; and
an amorphous silicon layer over and contacting the crystalline silicon layer.

19. The device of claim 14 further comprising an oxygen-scavenging metal layer over the high-k gate dielectric layer, wherein the oxygen-scavenging metal layer comprises oxygen and an additional material selected from the group consisting essentially of Ti, Hf, Zr, Tal, Al, TiN, TN, TaSiN, TiSiN, and combinations thereof.

20. The device of claim 19, wherein the oxygen-scavenging metal layer comprises TiAl.

* * * * *